United States Patent
Do et al.

(10) Patent No.: US 9,059,114 B2
(45) Date of Patent: Jun. 16, 2015

(54) FULL-COLOR LED DISPLAY DEVICE AND MANUFACTURING METHOD THEREOF

(75) Inventors: Young-Rag Do, Seoul (KR); Yeon-Goog Sung, Goyang-si (KR)

(73) Assignee: PSI CO., LTD, Gyeonggi-Do (KR)

( * ) Notice: Subject to any disclaimer, the term of this patent is extended or adjusted under 35 U.S.C. 154(b) by 0 days.

(21) Appl. No.: 14/114,338

(22) PCT Filed: Apr. 27, 2012

(86) PCT No.: PCT/KR2012/003324
§ 371 (c)(1),
(2), (4) Date: Jan. 7, 2014

(87) PCT Pub. No.: WO2012/148234
PCT Pub. Date: Nov. 1, 2012

(65) Prior Publication Data
US 2014/0124802 A1  May 8, 2014

(30) Foreign Application Priority Data

Apr. 29, 2011  (KR) .................. 10-2011-0040925

(51) Int. Cl.
| | | |
|---|---|---|
| *H01L 27/32* | (2006.01) | |
| *H01L 25/075* | (2006.01) | |
| *H01L 33/50* | (2010.01) | |
| *H01L 33/08* | (2010.01) | |
| *H01L 33/18* | (2010.01) | |
| *H01L 33/32* | (2010.01) | |

(Continued)

(52) U.S. Cl.
CPC ........ *H01L 27/3213* (2013.01); *H01L 27/3206* (2013.01); *H01L 25/0753* (2013.01);
(Continued)

(58) Field of Classification Search
CPC ..... H01L 33/50; H01L 33/504; H01L 27/153; H01L 33/0075; H01L 27/322; H01L 33/30; H01L 2224/73265; H01L 23/5386; H01L 27/0207; H01L 27/3218; H01L 27/3213; H01L 27/3206; H01L 27/3211; H01L 27/32
See application file for complete search history.

(56) References Cited

U.S. PATENT DOCUMENTS

| | | | |
|---|---|---|---|
| 6,949,772 B2* | 9/2005 | Shimizu et al. | ................. 257/99 |
| 7,591,699 B2 | 9/2009 | Morii | |

(Continued)

FOREIGN PATENT DOCUMENTS

| | | |
|---|---|---|
| JP | 2005-267991 A | 9/2005 |
| KR | 2006-0027791 A | 3/2006 |

(Continued)

*Primary Examiner* — Eduardo A Rodela
(74) *Attorney, Agent, or Firm* — Harness, Dickey & Pierce, P.L.C.

(57) ABSTRACT

Disclosed is a full-color LED display device and a manufacturing method thereof. The full-color LED display device includes 1) a plurality of first electrodes formed on a substrate, 2) at least five subminiature blue LED elements attached to each unit pixel site formed on the first electrode, 3) an insulation layer formed on the substrate and the blue LED element, 4) a plurality of second electrodes formed on the insulation layer, and 5) a green color conversion layer and a red color conversion layer formed on the second electrode corresponding to partial unit pixel sites selected from the unit pixel sites. The manufacturing method of a full-color LED display device includes 1) forming a plurality of first electrodes on a substrate, 2) attaching at least five subminiature blue LED elements to each unit pixel site formed on the first electrode, 3) forming an insulation layer on the substrate, 4) forming a plurality of second electrodes on the insulation layer, and 5) successively patterning a green color conversion layer and a red color conversion layer on the second electrode corresponding to partial unit pixel sites selected from the unit pixel sites.

20 Claims, 29 Drawing Sheets

(51) Int. Cl.
    *H01L 27/15*     (2006.01)
    *H01L 33/62*     (2010.01)
(52) U.S. Cl.
    CPC ............ *H01L33/50* (2013.01); *H01L 27/3211* (2013.01); *H01L 33/08* (2013.01); *H01L 33/18* (2013.01); *H01L 33/32* (2013.01); *H01L 33/504* (2013.01); *H01L 33/508* (2013.01); *H01L 27/15* (2013.01); *H01L 33/62* (2013.01); *H01L 2924/0002* (2013.01)

(56) References Cited

U.S. PATENT DOCUMENTS

| | | | |
|---|---|---|---|
| 7,700,964 B2 * | 4/2010 | Morimoto et al. | 257/98 |
| 7,727,788 B2 | 6/2010 | Han et al. | |
| 7,759,145 B2 | 7/2010 | Fujii | |
| 7,842,958 B1 * | 11/2010 | Sekine et al. | 257/88 |
| 7,943,945 B2 * | 5/2011 | Baretz et al. | 257/98 |
| 7,947,989 B2 * | 5/2011 | Ha et al. | 257/79 |
| 8,470,618 B2 | 6/2013 | Massies et al. | |
| 8,669,574 B2 * | 3/2014 | Konsek et al. | 257/98 |
| 2003/0214616 A1 * | 11/2003 | Komoto et al. | 349/96 |
| 2006/0071225 A1 * | 4/2006 | Beeson et al. | 257/98 |
| 2008/0210956 A1 * | 9/2008 | Kim | 257/88 |
| 2011/0018011 A1 * | 1/2011 | Beeson et al. | 257/89 |
| 2011/0089850 A1 | 4/2011 | Shibata et al. | |
| 2011/0175126 A1 * | 7/2011 | Yang et al. | 257/98 |

FOREIGN PATENT DOCUMENTS

| | | |
|---|---|---|
| KR | 2006-0083119 A | 7/2006 |
| KR | 2011-0040676 A | 4/2011 |

\* cited by examiner

FULL-COLOR LED DISPLAY DEVICE AND MANUFACTURING METHOD THEREOF

CROSS-REFERENCE TO RELATED APPLICATIONS

This application is a National Phase Entry of International Application No. PCT/KR2012/003324, filed on Apr. 27, 2012, which claims priority to Korean Patent Application Serial No. 10-2011-0040925, filed on Apr. 29, 2011, both of which are incorporated by reference herein.

TECHNICAL FIELD

The present disclosure relates to a full-color LED display device and a manufacturing method thereof, and more particularly, to a full-color LED display device capable of implementing a large-area LED full-color display and a manufacturing method thereof.

BACKGROUND

A Light-Emitting Diode (LED) TV, which has coming to the market, is an LCD TV adopting an LED backlight using white or three primary colors, more accurately an LCD TV using an LED backlight, instead of a Cold Cathode Fluorescent Lamp (CCFL) backlight of an existing LCD TV. As an LED full-color display presently available in the market, an ultra-large full-color outdoor electronic display board into which several ten thousands of three-color LED elements are inserted is known as a unique available product. Therefore, in an accurate conception, an LED full-color display is not yet adopted at the present as a home TV or a computer monitor. An existing LED element is not available as a display having a size of a TV or monitor due to the technical limits in relation to the manufacturing of an LED element and the full-color implementation technique. Presently, for an LED, an III-V group p-n light emitting diode is grown on a substrate of 2 to 8 inches by means of MOCVD and then cut into an appropriate size on which an electrode is wired, and then it is used as a unicolor or white LED element. In order to make a display for TV by using an III-V group wafer, in simple calculation, TV of 40 inches may be produced by attaching 5 to 20 wafers of 2 to 8 inches. In addition, in order to implement full-color with an LED, red-green-blue three-color LED elements should be put into a single pixel, and an LED full-color display may not be implemented by simply joining red-green-blue LED wafers. As another simple method for implementing an LED TV, a red-green-blue film or a nanorod-based LED element may be directly grown on a pixel of a large-area glass substrate for an actual display. However, this problem causes the same problems as when an LED is implemented by growing a high-quality III-V group film on a glass substrate by means of MOCVD. As well known in the art, the MOCVD for growing an III-V group film does not allow direct deposition on a substrate having a TV display size and also does not allow deposition of high-crystallinity and high-efficiency III-V group films or nanorods on a glass substrate. Due to such technical limits, there has not been proposed an effective technique for directly manufacturing a full-color display for a TV of 20 inches or above or a monitor of 14 inches or above by using an LED wafer.

In spite of the limits in manufacturing techniques and realistic possibility, an LED TV must be developed due to low light emission efficiency of an existing LCD display. As known in the art, a full-color TFT-LCD, which is dominating the TV and monitor market at the present, emits just about 5% of the light emitted from a backlight to the front surface. An LCD uses two polarizers during an on/off procedure for penetration/blocking of light, a color filter to converting a white light passing through a liquid crystal into a three-color light, and a plurality of optical films while uniformly dispersing the light generated from a single backlight lamp, which causes an optical attenuation of about 95%. In detail, it is known that a light emission efficiency of a full-color LCD display is 2 to 3 lm/W in case of using a backlight lamp of 60 lm/W. Therefore, in case of an LED-LCD TV using LED as a backlight, even though the efficiency of the LED is greatly improved, there is a limit in improvement of efficiency of an actual display. It is reported that a white LED recently developed already has efficiency of 100 lm/W or above, which is expected to reach 200 lm/W in a few years. Therefore, it will be easily understood that directly manufacturing a full-color display by using high-efficiency LED is the most suitable method in aspect of light emission efficiency, in comparison to manufacturing a display by using high-efficiency LED as the LCD backlight.

Therefore, a technique required for realizing a high-efficiency LED display becomes a main issue of this study. If technical or physical limits are not considered, developing a method for directly manufacturing LED pixels on a large-area display glass substrate will be the path of least resistance, which can be conceived by anyone. However, if the techniques for IIV-V growth are understood just a little, it will be figured out that this cannot be realized by the present techniques. Therefore, it will be reasonable in aspect of light emission efficiency to develop a new structure and technique for manufacturing a full-color LED display by using an existing high-efficiency III-V group LED wafer grown by means of MOCVD. Until now, the LED display manufacture and element techniques have been developed to implement a display by arranging one LED element at one pixel. For example, it has been reported that in case of a recently developed micro-sized LED display, a small micro LED display has been developed by fabricating one pixel with one micro LED. As another example, there is also reported a technique for manufacturing a display of a desired size by fabricating an LED of a micro size on a plastic substrate with great elasticity and then extending the substrate to increase its area. The technique for manufacturing a display in which a single micro LED array corresponds to a single pixel is easy to develop a subminiature micro LED display but has very high technical thresholds to be overcome in order to have a great area suitable for a TV or monitor. Moreover, if several LEDS are poor among several ten thousands of LEDS of the display, the entire display may be poor. Therefore, in order to implement a high efficiency LED display, there is needed a creative and simple structure and technique which may overcome the existing techniques.

SUMMARY

The present disclosure is directed to providing a full-color LED display device, which is suitable for manufacturing a large-area color-by-blue LED full-color display and allows a subminiature LED element to be accurately located on a sub-pixel (pixel site) of an LED display without lying or turning over, and a manufacturing method thereof. The present disclosure is also directed to providing a full-color LED display device, which is suitable for manufacturing a RGB LED full-color display and allows a subminiature LED element to be accurately located on a sub-pixel (pixel site) of an LED display without lying or turning over, and a manufacturing method thereof. Moreover, the present disclosure is also directed to providing a method for manufacturing a large-area LED display by using an LED wafer of a relatively smaller size, since the subminiature LEDs are located in less than 20% of the entire area of the display, preferably less than 10%.

In one aspect to accomplish the first object, there is provided a manufacturing method of a full-color LED display device, comprising:

1) forming a plurality of first electrodes on a substrate;
2) attaching at least five subminiature blue LED elements to each unit pixel site formed on the first electrode;
3) forming an insulation layer on the substrate;
4) forming a plurality of second electrodes on the insulation layer; and
5) successively patterning a green color conversion layer and a red color conversion layer on the second electrode corresponding to partial unit pixel sites selected from the unit pixel sites.

In another aspect to accomplish the first object, there is provided a manufacturing method of a full-color LED display device, comprising:

1) forming a plurality of first electrodes on a substrate;
2) attaching at least one LED element among at least five subminiature blue, green and red LED elements to each unit pixel site formed on the first electrode;
3) forming an insulation layer on the substrate; and
4) forming a plurality of second electrodes on the insulation layer.

According to an embodiment of the present disclosure, the first electrodes and second electrodes may be formed in a stripe shape to cross each other, and the unit pixel sites may be formed at portions corresponding to crossing points of the first electrodes and the second electrodes. According to another embodiment of the present disclosure, the unit pixel sites may have an area of $1\times10^4$ $\mu m^2$ or less, more preferably $1\times10^2$ $\mu m^2$ or less, and the unit pixel sites of the first electrodes may have grooves of a predetermined depth. According to another embodiment of the present disclosure, the subminiature LED elements may have a diameter of 50 to 3000 nm with a single or bundle form, and an insulation coating may be formed at the outer circumference of the LED elements. According to another embodiment of the present disclosure, the subminiature LED elements may be in a paste or ink form.

According to another embodiment of the present disclosure, Step 2) may include:

2-1) forming first coupling linkers, which are capable of being coupled to the unit pixel sites, on the unit pixel sites formed on the first electrode;
2-2) adding metal micro powder capable of being coupled to the first coupling linkers;
2-3) attaching at least five subminiature blue LED elements, to which second coupling linkers capable of being coupled to the metal micro powder are attached, to each unit pixel site; and
2-4) forming a metallic ohmic layer between the unit pixel site and the subminiature blue LED element by soldering the metal micro powder.

According to another embodiment of the present disclosure, Step 2) may include:

2-5) forming first coupling linkers, which are capable of being coupled to the unit pixel sites, on the unit pixel sites formed on the first electrode;
2-6) adding metal micro powder capable of being coupled to the first coupling linkers;
2-7) attaching at least five LED elements among the subminiature blue, green and red LED elements, to which second coupling linkers capable of being coupled to the metal micro powder are attached, to each unit pixel site; and
2-8) forming a metallic ohmic layer between the unit pixel site and the subminiature blue LED element by soldering the metal micro powder. According to another embodiment of the present disclosure, the manufacturing method may further include forming a short wavelength penetration filter (SWPF) between Step 4) and Step 5); and forming a long wavelength penetration filter (LWPF) after Step 5).

In an aspect to accomplish the second object, there is provided a full-color LED display device, comprising:

1) a plurality of first electrodes formed on a substrate;
2) at least five subminiature blue LED elements attached to each unit pixel site formed on the first electrode;
3) an insulation layer formed on the substrate and the blue LED element;
4) a plurality of second electrodes formed on the insulation layer; and
5) a green color conversion layer and a red color conversion layer formed on the second electrode corresponding to partial unit pixel sites selected from the unit pixel sites.

In another aspect to accomplish the second object, there is provided a full-color LED display device, comprising:

1) a plurality of first electrodes formed on a substrate;
2) at least one LED element among at least five subminiature blue, green and red LED elements attached to each unit pixel site formed on the first electrode;
3) an insulation layer formed on the substrate; and
4) a plurality of second electrodes formed on the insulation layer.

According to an embodiment of the present disclosure, the subminiature blue, green and red LED elements may have a diameter of 50 to 3000 nm with a single or bundle type, and an insulation coating may be formed at an outer circumference of the LED elements. According to another embodiment of the present disclosure, a metallic ohmic layer may be formed between the unit pixel site and the subminiature LED element. According to another embodiment of the present disclosure, the unit pixel site may have an area of $1\times10^4$ $\mu m^2$ or below, and grooves of a predetermined depth may be formed at the unit pixel sites of the first electrodes.

According to another embodiment of the present disclosure, the first electrodes and second electrodes may be formed in a stripe shape to cross each other, and the unit pixel sites may be formed at portions corresponding to crossing points of the first electrodes and the second electrodes. According to another embodiment of the present disclosure, a short wavelength penetration filter may be formed between the second electrode and the subminiature red or green LED elements, and a long wavelength penetration filter may be formed on the subminiature red or green LED elements.

Hereinafter, terms used in the present disclosure will be described. The term "pixel sites" is also called "sub-pixels" and represents a plurality of regions formed at the first electrode of the LED display, which means locations to which the subminiature LED elements are attached. A plurality of "pixel sites" may be formed along the first electrode, and if the first electrode is arranged with a stripe shape, the pixel sites may be formed at regular intervals along the first electrode. The term "unit pixel site" means a single pixel site.

Since at least five subminiature LED elements are coupled on each unit pixel site of the full-color LED display according to the present disclosure, it is possible to minimize a defect rate and manufacture a large-area high-efficiency full-color LED display. In addition, since the subminiature LED elements of the present disclosure may be freely assembled into a desired pixel pattern by using the coupling linkers, and the subminiature LED element may be accurately located on the sub-pixel of the LED display without lying or turning over, thereby greatly improving the efficiency of the LED display. Moreover, in the full-color LED display of the present disclosure, the optical loss problem caused by polarizers, color filters or the like decreases in comparison to an existing LCD display based on an LED backlight, which reduces the limit in efficiency and greatly improves an energy loss. In addition, the subminiature LED element of the present disclosure is a technique capable of overcoming the limit in productivity and size, which may occur in an existing LED display, and a true LED display of a TV size may be implemented since a small-sized LED wafer substrate may be expanded to a display of a TV size.

DETAILED DESCRIPTION

As described above, an existing full-color LED display has a limit in realizing a large design and has a very high defect rate. In order to solve this problem, the present disclosure provides a manufacturing method of a full-color LED display device, which includes: 1) forming a plurality of first electrodes on a substrate; 2) attaching at least five subminiature blue LED elements to each unit pixel site formed on the first electrode; 3) forming an insulation layer on the substrate; 4) forming a plurality of second electrodes on the insulation layer; and 5) successively patterning a green color conversion layer and a red color conversion layer on the second electrode corresponding to partial unit pixel sites selected from the unit pixel sites. By doing so, since at least five subminiature LED elements are coupled on each unit pixel site of the full-color LED display according to the present disclosure, it is possible to minimize a defect rate and manufacture a large-area high-efficiency full-color LED display.

Figure 1:
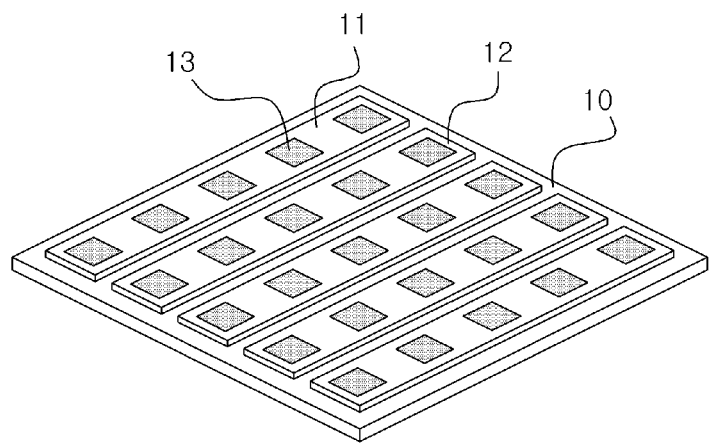
FIG. 1 is a perspective view for illustrating a step of patterning a first electrode on a surface of an LED display substrate according to the present disclosure.

First, in Step 1), a plurality of first electrodes is formed on a substrate. FIG. 1 is a perspective view for illustrating a step of patterning a first electrode on a surface of an LED display substrate according to an embodiment of the present disclosure, and first electrodes 11, 12 may be formed on one surface of the substrate 10 in a stripe shape in the lateral direction. In this case, the substrate 10 may have a large area of 10 inches or above, but may also have a smaller area without being limited thereto. The substrate 10 available in the present disclosure is not limited in its kind if it can be used as a general LED display, but preferably a transparent glass substrate or a plastic substrate may be used.

A plurality of first electrodes 11, 12 is formed on the substrate 10. The first electrodes 11, 12 may be prepared using a common way, and preferably may be formed by coating the substrate 10 with conductive material and then patterning the substrate into a predetermined shape. Here, the first electrodes 11, 12 may be formed with a strip shape. The first electrodes 11, 12 may be made of a metal electrode such as Al or transparent conductive material such as indium tin oxide (ITO). The first electrodes 11, 12 may have a diameter of 10 to 50 μm, without being limited thereto.

Next, in Step 2), the plurality of subminiature blue LED elements is attached to unit pixel sites formed on the first electrode. Each of the unit pixel sites preferably has an area of $1 \times 10^4$ μm$^2$ or below, more preferably $1 \times 10^2$ μm$^2$ or below, which is 10% or below of a unit pixel area of a general LED display. For example, when a pixel pattern size of an actual display is 100 μm×100 μm, the unit pixel at which the subminiature LED of the present disclosure is located may be 10 μm×10 μm, which may minimize an area ratio actually occupied by the subminiature LED and allow designing a large size. Meanwhile, the unit pixel sites may have the same area or different areas. In addition, the unit pixel sites may be separately surface-treated or have grooves formed thereon.

Meanwhile, as described above, an existing LED display includes a single subminiature blue LED element attached to a unit pixel site. However, in this case, if the attached subminiature LED element has a defect, the efficiency of the entire LED display greatly deteriorates. Therefore, in the present disclosure, at least five subminiature LED elements are attached onto a unit pixel site to solve the above problem. If four or less subminiature LEDs are used, a defect occurring at one subminiature LED causes 25% or above optical characteristic change, which increases the possibility of defect. However, if at least five subminiature LEDs are used, a defect occurring at one subminiature LED causes 20% or above optical characteristic change, which increases the defect ratio. From this, even though a part of the at least five subminiature LED elements attached onto the unit pixel sites have a defects, since the other subminiature LED elements are normal, each unit pixel site may normally emit light by the subminiature LED elements, thereby minimizing a defect ratio of the LED display as a whole and maximizing the light emission efficiency.

The subminiature LED element available in the present disclosure may have a shape such as a cylindrical shape, a rectangular shape or the like without limitation, but preferably a cylindrical shape. In case of the cylindrical shape, the diameter (the diameter of the circle) may be 50 to 3000 nm, and the height may be 1.5 to 7 μm, without being limited thereto.

The subminiature LED element available in the present disclosure may be the subminiature LED element disclosed in Korean Patent Application No. 2011-40174 or the subminiature LED element disclosed in Korean Patent Application No. 2011-40175, without being limited thereto. In particular, in case of using a subminiature LED element bundle in which at least five subminiature LED elements are coupled by a binder, it is easy to handle a subminiature LED element of a very small size, and it is very advantageous to accurately locate the subminiature LED element on the pixel site of the LED display without lying or turning over, in comparison to the case of attaching individual subminiature LED elements separately.

Meanwhile, a coupling linker may be formed at one surface of the subminiature LED elements employed in the present disclosure. Since the subminiature LED element has a very small size, when being attached to the pixel sites of the LED display substrate, the subminiature LED element may not stand upright but lie down or turn over. In order to prevent his, the surface of the electrode of the subminiature LED element is coated with a coupling linker for self-assembling, and a second linker capable of being coupled to the coupling linker is formed at the pixel sites of the LED display substrate. In this case, even though the subminiature LED element is transferred or added to the sub-pixel in an ink or paste form, the subminiature LED element does not lie down or turn over but the electrode surface may be attached to a sub-pixel at a desired location. In addition, even though the second linker is not formed, if a functional group remaining in the coupling linker is coupled to the surface of the sub-pixel of the LED display substrate, it is possible to prevent the subminiature LED element from lying or turning over without standing upright.

The coupling linker should be coupled to an electrode surface of the subminiature LED element, the surface of the pixel sites of the display substrate and/or the second linker formed at the pixel sites. For this, the coupling linker may have at least two functional groups. In detail, the coupling linker may contain thiol-based aminoethanethiol or its oxide, which reacts with metal, and aminopropyltrirthoxysilane reacting with it, without being limited thereto. In addition, the second linker formed on the surface of the pixel sites of the display substrate may use any material capable of being complementarily coupled with the coupling linker of the present disclosure without limitation, preferably materials in the same group as the coupling linker, without being limited thereto. Subsequently, if an adhesive is added to the coupling surface of the subminiature LED elements and the pixel sites, the subminiature LED elements may be attached to the pixel sites without lying or turning over.

Meanwhile, according to an embodiment of the present disclosure, Step 2) may include 2-1) forming first coupling linkers, which are capable of being coupled to the unit pixel sites, on the unit pixel sites formed on the first electrode; 2-2) adding metal micro powder capable of being coupled to the first coupling linkers; 2-3) attaching at least five subminiature blue LED elements, to which second coupling linkers capable of being coupled to the metal micro powder are attached, to each unit pixel site; and 2-4) forming a metallic ohmic layer between the unit pixel site and the subminiature blue LED element by soldering the metal micro powder.

Figure 2A:
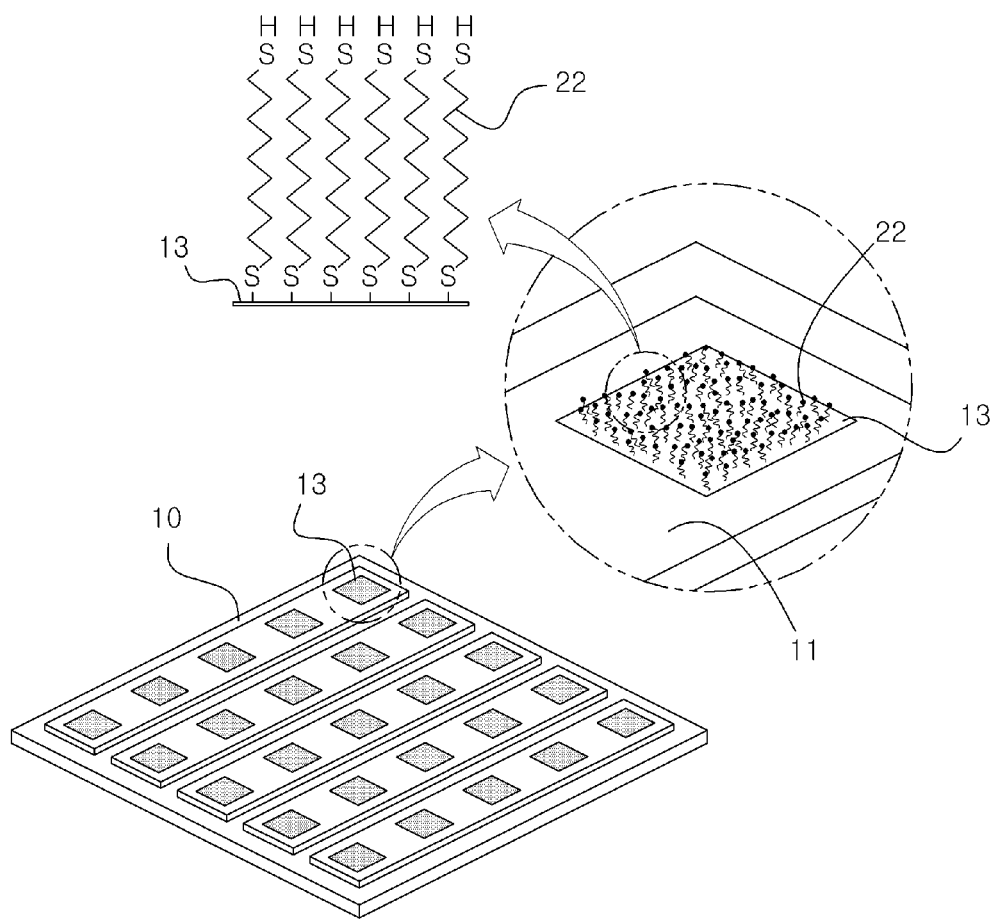
FIG. 2a is a perspective view for illustrating a step of forming coupling linkers at surfaces of pixel sites formed on the first electrode of the present disclosure.

FIGS. 2a to 2e are perspective views showing each stage of the method for coupling the subminiature blue LED elements to the pixel sites. First, FIG. 2a is a perspective view for illustrating a step of forming first coupling linkers on the surface of pixel sites formed on the first electrode of the present disclosure. A first coupling linker 22 is attached to a pixel site 13 formed at the first electrode 11 of the substrate 10. The first coupling linker 22 may include at least two combinable functional groups, among which one functional group may be coupled to the pixel site 13 and the other functional group may be coupled to metal micro powder or the like, described later. At this time, the first coupling linker may employ any material capable of being coupled to the pixel site 13 without limitation, and thiol-based dithiol or the like reacting with metal may be used, without being limited thereto.

Figure 2B:
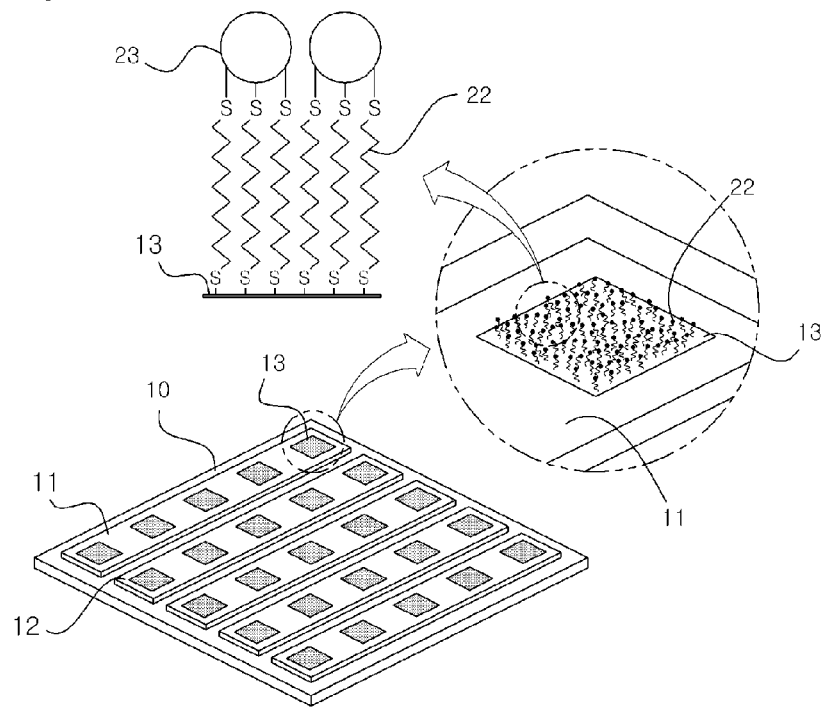
FIG. 2b is a perspective view for illustrating a step of coating the coupling linkers formed on the surface of the pixel sites with metal micro powder.

Next, FIG. 2b is a perspective view for illustrating a step of coating the coupling linker formed on the surface of the pixel sites with metal micro powder. In detail, if the metal micro powder 23 is added to the plurality of first coupling linker 22 formed on the pixel site 13 through FIG. 2a, a non-reacting functional group of the first coupling linker 22 is coupled to the surface of the metal micro powder 23. In this case, a plurality of first coupling linker 22 may be coupled to a single metal micro powder 23. In addition, the metal micro powder 23 may have a diameter of 5 to 100 nm, without being limited thereto, and the metal micro powder 23 may have a shape of a spherical shape, an oval shape, a rod type, a wire type, a nano-tube type or the like. The metal micro powder 23 may use any material which may be coupled to the coupling linker and may also easily form a metallic ohmic layer in a following soldering process, without limitation, but the metal micro powder 23 may preferably use Ag, Au solely or in combination.

Figure 2C:
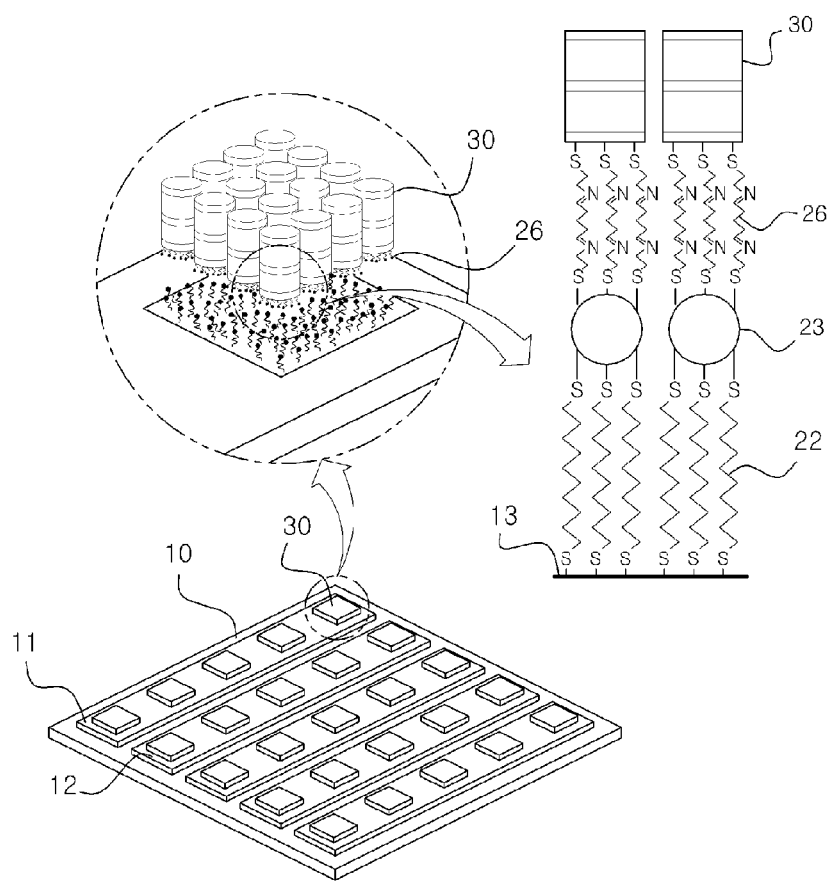
FIG. 2c is a perspective view for illustrating a step of attaching a plurality of subminiature blue LED elements to the pixel sites coated with the metal micro powder.
Figure 2D:
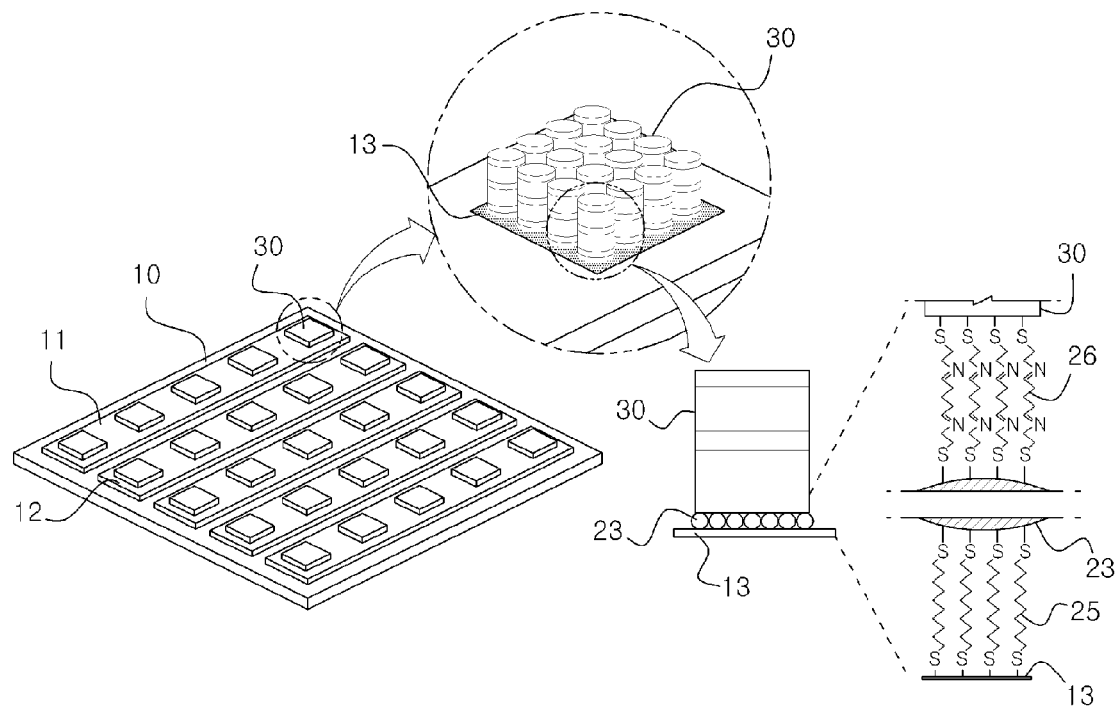
FIG. 2d is a perspective view showing a coupling linker formed at a pixel site and a coupling relation formed between the metal micro powder and the coupling linker formed at one surface of a subminiature LED element.

Next, FIG. 2c is a perspective view for illustrating a step of attaching at least five subminiature blue LED elements to the pixel sites coated with the metal micro powder. The subminiature blue LED elements 30 have second coupling linkers 26 formed at one surface thereof and capable of being coupled to the surface of the metal micro powder 23. In this case, the second coupling linker may use any material capable of being coupled to the metal micro powder 23 without limitation, and may use thiol-based aminoethanethiol, dithiol or their oxide, which react with metal, and aminopropyltrirthoxysilane reacting with it, without being limited thereto. In addition, as shown in FIG. 2d, one subminiature blue LED element 30 may also be coupled to a plurality of metal micro powders 23.

Figure 2E:
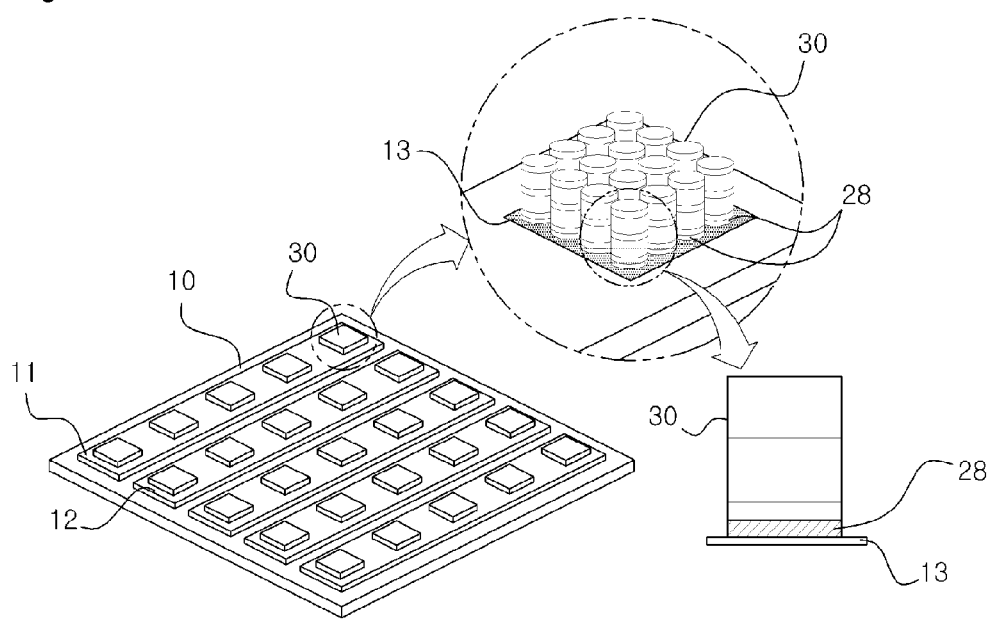
FIG. 2e is a perspective view showing a metallic ohmic layer formed between the pixel sites and the subminiature LED elements after a soldering process.
Figure 3:
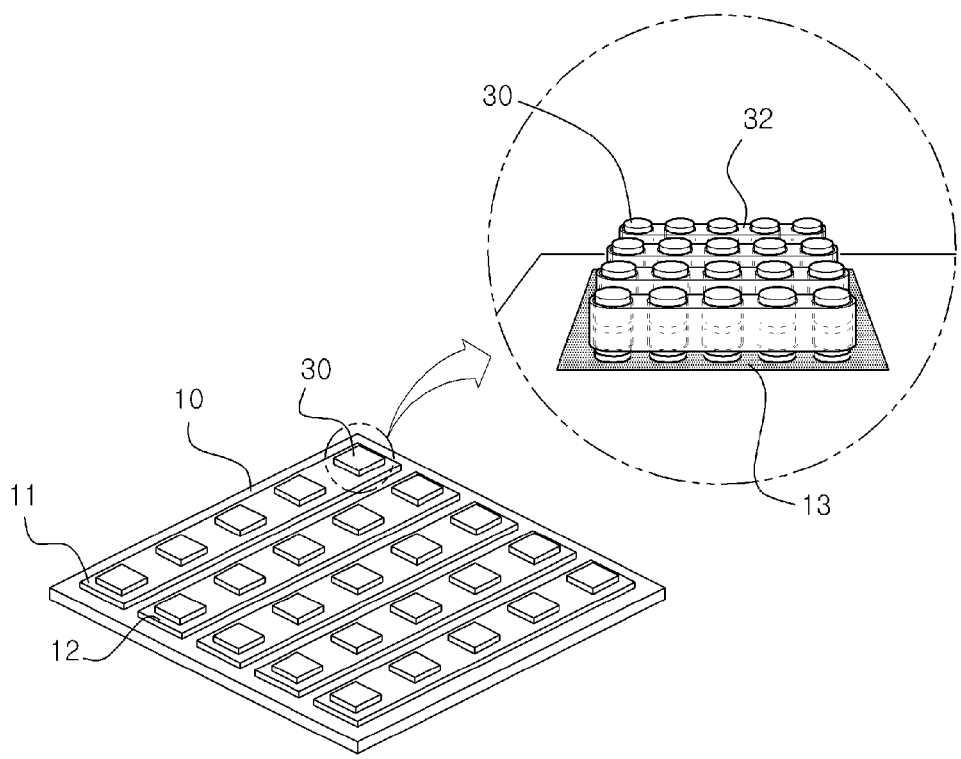
FIG. 3 is a perspective view for illustrating a step of coupling a subminiature LED element bundle to the sub-pixel of the present disclosure.

Next, FIG. 2e is a perspective view showing a metallic ohmic layer formed between the pixel sites and the subminiature blue LED elements after a soldering process. In detail, after the first coupling linkers formed on the pixel sites and the second coupling linkers formed on one surface of the metal micro powder and the subminiature blue LED element are successively coupled, the first coupling linker and the second coupling linker entirely burn out and become extinct through the soldering process (burn out), and the metal micro powder 23 is melted to form the metallic ohmic layer 28 and plays a role of fixing the subminiature blue LED elements 30 to the pixel site 13. At this time, the metallic ohmic layer 28 may have a thickness of 5 to 100 nm, without being limited thereto. In addition, the soldering process may be performed in a common way, preferably by partially heating the pixel sites 13 at a temperature capable of selectively melting only the metal micro powder 23 without giving an impact to the substrate and the subminiature blue LED element. More preferably, when the metal micro powder 23 is made of Ag, the metal micro powder 23 may be melted by entirely or locally heating to 200 to 500° C. to form the metallic ohmic layer 28. However, the metallic ohmic layer 28 may also be formed in various ways, without being limited thereto. FIG. 3 is a perspective view for illustrating a step of coupling the subminiature blue LED element bundle 30 to the pixel site 13 by using a binder 32 according to an embodiment of the present disclosure.

Figure 4:
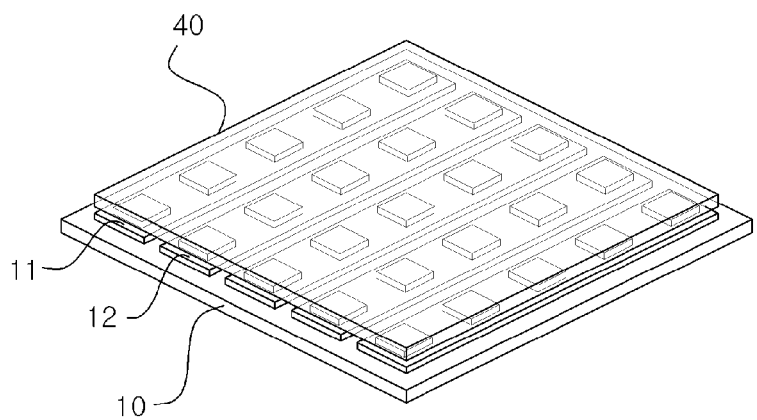
FIG. 4 is a perspective view for illustrating a step of forming an insulation layer on the subminiature LED element of the present disclosure.

After that, in Step 3), an insulation layer is formed on the substrate. FIG. 4 is a perspective view for illustrating a step of forming the insulation layer, and the insulation layer 40 is formed on a partial region or an entire region of the substrate 10, the first electrodes 11, 12 and the subminiature blue LED elements coupled to the pixel sites. The insulation layer 40 plays a role of preventing the first electrode from contacting the second electrode layer or the subminiature LED from causing an electric short circuit. The insulation layer may have a thickness of 1.5 to 7 μm, identical to the height of the subminiature LED, without being limited thereto. In addition, the insulation layer 40 may use oxides or nitrides, for example silicon oxide ($SiO_2$) or silicon nitride (SiN), without being limited thereto.

Figure 5:
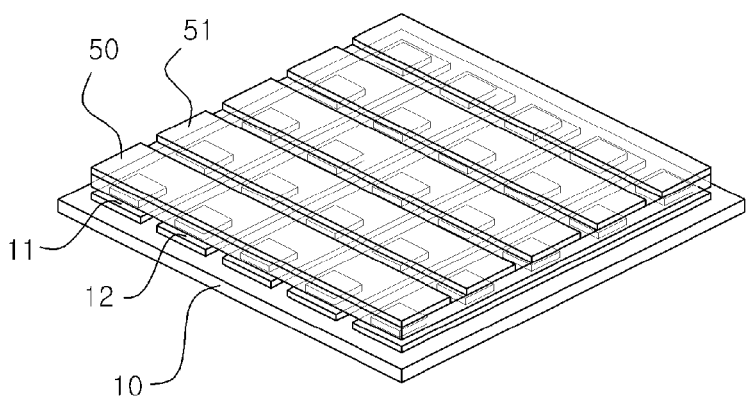
FIG. 5 is a perspective view for illustrating a step of forming a second electrode on the insulation layer of the present disclosure.

Next, in Step 4), a plurality of second electrodes is formed on the insulation layer. Referring to FIG. 5, the second electrodes 50, 51 are formed at the right upper portion of the subminiature blue LED elements 30, and here, the second electrodes 50, 51 may be formed to cross the first electrodes 11, 12. The second electrodes 50, 51 may be formed in a stripe shape, identical to the first electrodes 11, 12. In addition, the second electrodes 50, 51 may be made of, for example, a metal electrode such as Al or a transparent conductive material such as indium tin oxide (ITO).

Figure 6:
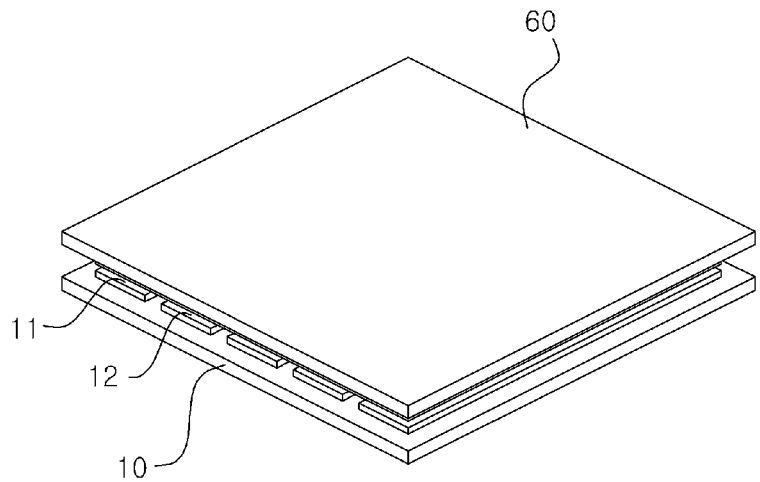
FIG. 6 is a perspective view for illustrating a step of forming a short wavelength penetration filter on the second electrode of the present disclosure.

Next, the method may further include Step 5) for forming a short wavelength penetration filter 60 on the second electrodes 50, 51 to enhance the light emission efficiency by allowing a blue LED light to penetrate and reflecting the light emitting from the rear surface of a color-by-blue display at green/red photoconversion material. FIG. 6 is a perspective view for illustrating a step of forming a short wavelength penetration filter 60 on the second electrodes. At this time, the short wavelength penetration filter 60 may use a multilayer in which films made of high-refraction/low-refraction materials are repeatedly formed, and may have a composition of $[0.5SiO_2/TiO_2/0.5SiO_2]^m$ (m=the number of repeated layers, m is 7 or above). In addition, the short wavelength penetration filter 60 may have a thickness of 1 to 5 μm, without being limited thereto.

Figure 7:
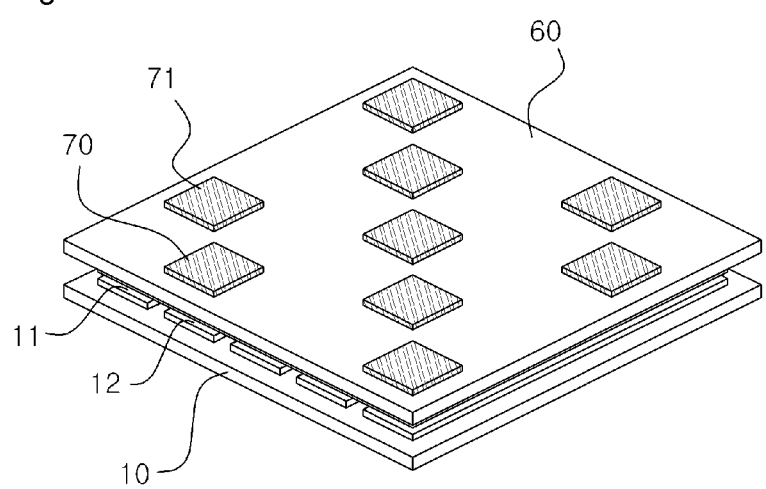
FIG. 7 is a perspective view for illustrating a step of forming a plurality of green conversion layers on the second electrode which correspond to partial pixel sites selected from the pixel sites on the short wavelength penetration filter of the present disclosure.

Next, the method may further include Step 6) for patterning a green color conversion layer on the second electrode corresponding to partial pixel sites selected from the pixel sites, and patterning a red color conversion layer on the second electrode corresponding to partial pixel sites selected from the pixel sites. FIG. 7 is a perspective view for illustrating a step of forming a plurality of green conversion layers on the second electrode corresponding to partial pixel sites selected from the pixel sites on the short wavelength penetration filter of the present disclosure. In detail, the green conversion layers 70, 71 are formed at a partial region of the right upper portion of the subminiature blue LED elements 30 formed at the pixel sites 13, a blue light irradiated from the subminiature blue LED elements 30 at a lower side is transferred to the green conversion layers 70, 71, and by doing so, the green conversion layers 70, 71 emit light to irradiate a green light. At this time, the green conversion layers 70, 71 may use any material available in a common color-by-blue method without limitation, preferably a fluorescent layer containing green fluorescent material, more preferably at least one fluorescent material selected from the group consisting of $SrGa_2S_4$:Eu, $(Sr,Ca)_3SiO_5$:Eu, $(Sr,Ba,Ca)SiO_4$:Eu, $Li_2SrSiO_4$:Eu, $Sr_3SiO_4$:Ce,Li, β-SiALON:Eu, $CaSc_2O_4$:Ce, $Ca_3Sc_2Si_3O_{12}$:Ce, Caα-SiALON:Yb, Caα-SiALON:Eu, Liα-SiALON:Eu, $Ta_3Al_5O_{12}$:Ce, $Sr_2Si_5N_8$:Ce, $SrSi_2O_2N_2$:Eu, $BaSi_2O_2N_2$:Eu, $Ba_3Si_6O_{12}N_2$:Eu, γ-AlON:Mn and γ-AlON:Mn,Mg, without being limited thereto.

Figure 8:
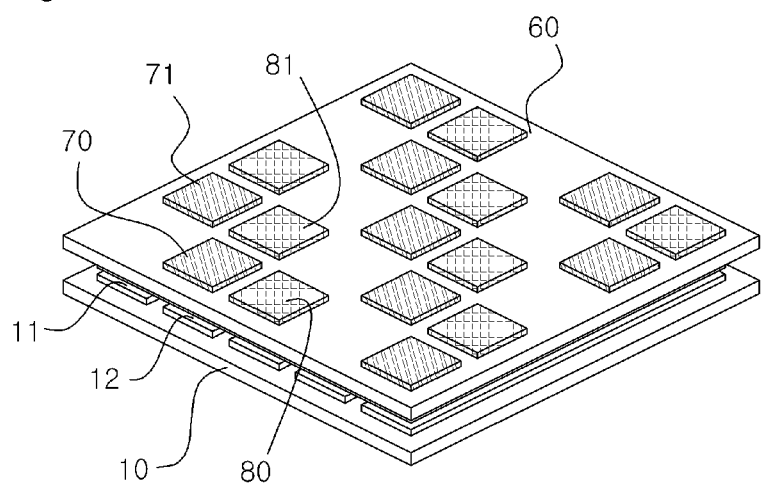
FIG. 8 is a perspective view for illustrating a step of forming a plurality of red conversion layers on the second electrode which correspond to partial pixel sites selected from the pixel sites on the short wavelength penetration filter of the present disclosure.

FIG. 8 is a perspective view for illustrating a step of forming a plurality of red conversion layer on the second electrode corresponding to partial pixel sites selected from the pixel sites on the short wavelength penetration filter of the present disclosure. In detail, the red conversion layers 80, 81 are formed at a partial region of the right upper portion of the subminiature blue LED elements 30 formed at the pixel sites 13. A blue light irradiated from the subminiature blue LED elements 30 at a lower side is transferred to the red conversion layers 80, 81, and by doing so, the red conversion layers 80, 81 emit light to irradiate a red light. In this case, the red conversion layers 80, 81 may be formed in a partial region of the right upper portion of the pixel sites, except for a region where the green conversion layers 70, 71 are formed. At this time, the red conversion layers 80, 81 may use any material available in a common color-by-blue method without limitation, preferably a fluorescent layer containing green fluorescent material, more preferably at least one fluorescent material selected from the group consisting of (Sr,Ca)$AlSiN_3$:Eu, $CaAlSiN_3$:Eu, (Sr,Ca)S:Eu, $CaSiN_2$:Ce, $SrSiN_2$:Eu, $Ba_2Si_5N_8$:Eu, CaS:Eu, CaS:Eu, Ce, SrS:Eu, SrS:Eu, Ce and $Sr_2Si_5N_8$:Eu, without being limited thereto. In addition, the patterning order of the green conversion layer and the red conversion layer is not specially limited, and they may be patterned simultaneously or in an inverse order.

Meanwhile, if the LED display substrate is observed from the right above, in partial pixel sites, only the subminiature blue LED elements 30 are formed and a green conversion layer and a red conversion layer are not formed at their right upper portion, thereby irradiating a blue light. In addition, in partial pixel sites, a green conversion layer is formed at the right upper portion of the subminiature blue LED elements 30, thereby irradiating a green light. In addition, in other partial pixel sites, a red conversion layer is formed at the right upper portion of the subminiature blue LED elements 30, thereby irradiating a red light.

Figure 9:
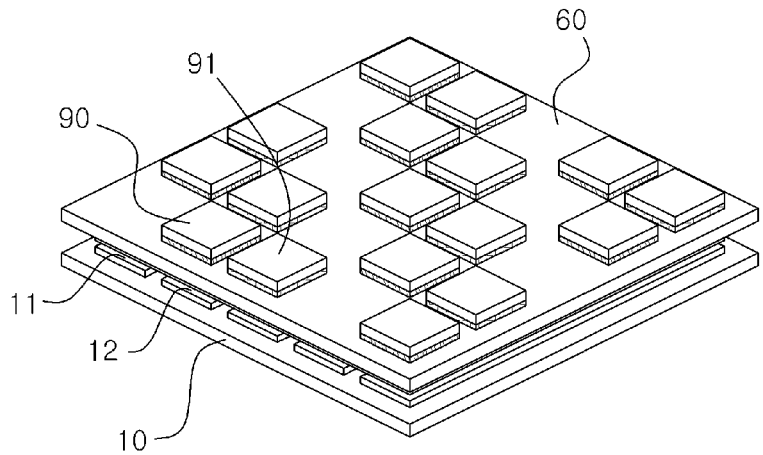
FIG. 9 is a perspective view for illustrating a step of forming a long wavelength penetration filter on the red and/or green LED elements of the present disclosure.

After that, in Step 7), a long wavelength penetration filter may be further formed on the green conversion layer and the red conversion layer in order to prevent the blue light emitted from the subminiature LED and the light emitted from the green/red conversion layers from being mixed and deteriorating the color purity. FIG. 9 is a perspective view for illustrating a step of forming long wavelength penetration filters 90, 91, and the long wavelength penetration filters 90, 91 may be formed on a partial or entire upper portion of the green conversion layer and the red conversion layer. At this time, the long wavelength penetration filters 90, 91 may be a multilayer in which films of high refractive/low refractive materials are repeatedly formed, and may have a composition of $[0.5TiO_2/SiO_2/0.5TiO_2]^m$ (m=the number of repeated layers, m is 7 or above). In addition, the long wavelength penetration filters 90, 91 may have a thickness of 1 to 5 μm, without being limited thereto.

The LED display of the present disclosure manufactured according to the above method includes: 1) a plurality of first electrodes formed on a substrate; 2) at least five subminiature blue LED elements attached to each unit pixel site formed on the first electrode; 3) an insulation layer formed on the substrate and the blue LED element; 4) a plurality of second electrodes formed on the insulation layer; and 5) a green color conversion layer and a red color conversion layer formed on the second electrode corresponding to partial unit pixel sites selected from the unit pixel sites. In addition, a short wavelength penetration filter and/or a long wavelength penetration filter may be further formed.

Meanwhile, according to another embodiment of the present disclosure, there is also provided a manufacturing method of a full-color LED display device, which includes: 1) forming a plurality of first electrodes on a substrate; 2) attaching at least one LED element among at least five subminiature blue, green and red LED elements to each unit pixel site formed on the first electrode; 3) forming an insulation layer on the substrate; and 4) forming a plurality of second electrodes on the insulation layer.

Hereinafter, the manufacturing method of a full-color LED display device according to another embodiment of the present disclosure will be described, except for the same features as the manufacturing method of a full-color LED display device by means of color-by-blue. First, in Step 1), a plurality of first electrodes is formed on a substrate, identical to the former embodiment.

Next, in Step 2), at least one LED element among at least five subminiature blue, green and red LED elements is attached to each unit pixel site formed on the first electrode. Here, at least five subminiature LED elements are attached to each unit pixel site.

Figure 10A:
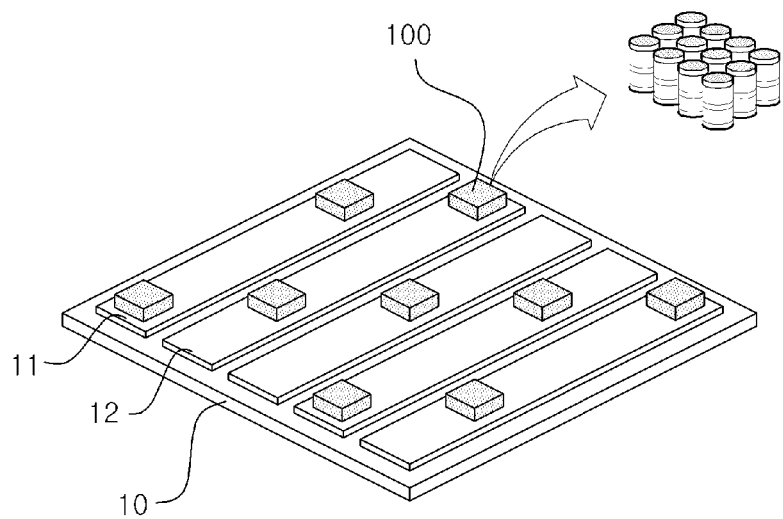
FIG. 10a is a perspective view for illustrating a step of coupling at least five red subminiature LED element to partial sub-pixels of the present disclosure.
Figure 10B:
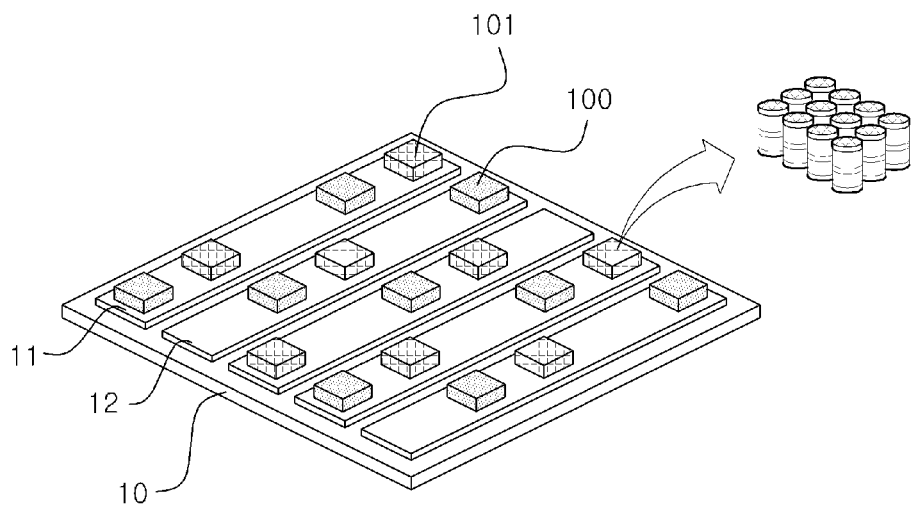
FIG. 10b is a perspective view for illustrating a step of coupling at least five green subminiature LED elements to partial sub-pixels.

FIG. 10a shows a substrate 10, a plurality of first electrodes 11, 12 formed on the substrate, and subminiature blue LED elements 100 attached to partial pixel sites selected from the pixel sites formed at the first electrodes. In this case, similar to the former case, at least five subminiature blue LED elements are attached to a single unit pixel site. In FIG. 10b, subminiature green LED elements 101 are attached to partial pixel sites selected from the pixel sites in a region where the subminiature blue LED elements are not attached. In this case, as described above, at least five subminiature green LED elements are attached to a single unit pixel site, and subminiature green LED elements having the same size as the subminiature blue LED elements may be used.

Figure 10C:
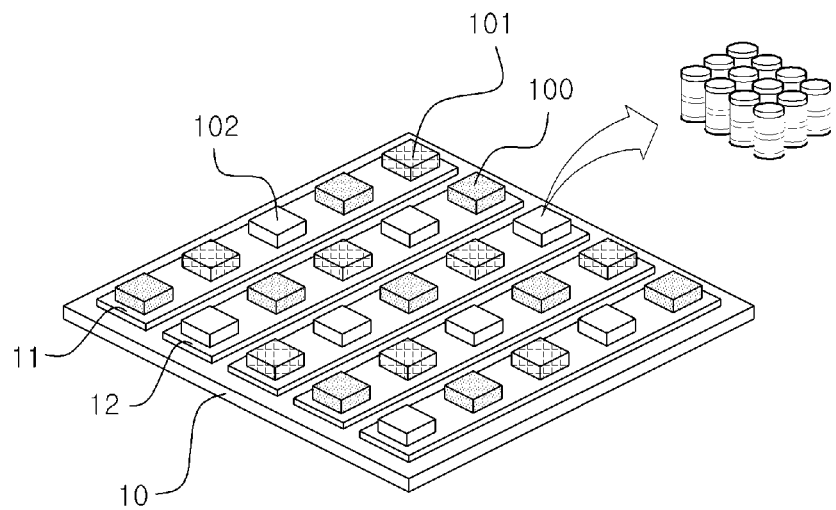
FIG. 10c is a perspective view for illustrating a step of coupling at least five blue subminiature LED elements to partial sub-pixels.

In FIG. 10c, subminiature red LED elements 102 are attached to pixel sites to which the subminiature blue LED elements 100 and the subminiature green LED elements 101 are not attached. In this case, as described above, at least five subminiature red LED elements are attached to a single unit pixel site, and subminiature red LED elements having the same size as the subminiature blue LED elements may be used. The subminiature blue, green and red LED elements may be attached simultaneously or in any order.

In addition, first coupling linkers may be formed at the pixel sites and second coupling linkers may be formed at one surface of the subminiature blue, green and red LED elements and directly coupled thereto. In other case, metal micro powder may be added and a soldering process may be performed to form a metallic ohmic layer. As a result, the subminiature blue LED elements may be attached to partial pixel sites among the entire pixel sites, the subminiature green LED elements may be attached to other pixel sites, and the subminiature red LED elements may be attached to still other pixel sites.

Figure 11:
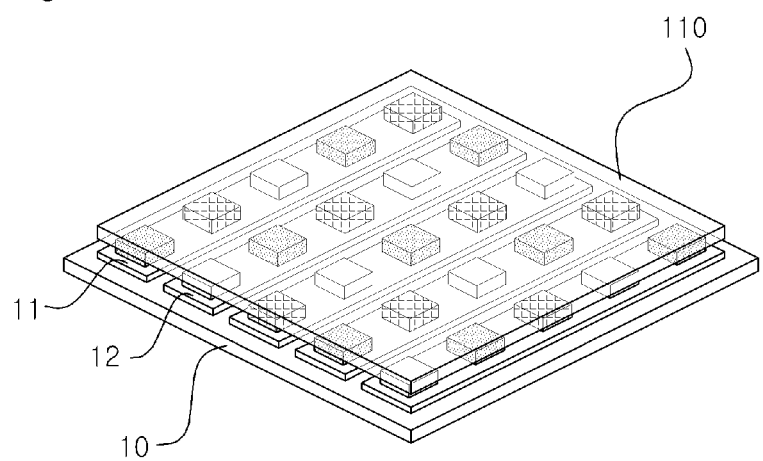
FIG. 11 is a perspective view for illustrating a step of forming an insulation layer on the subminiature red, green and blue LED elements of the present disclosure.
Figure 12:
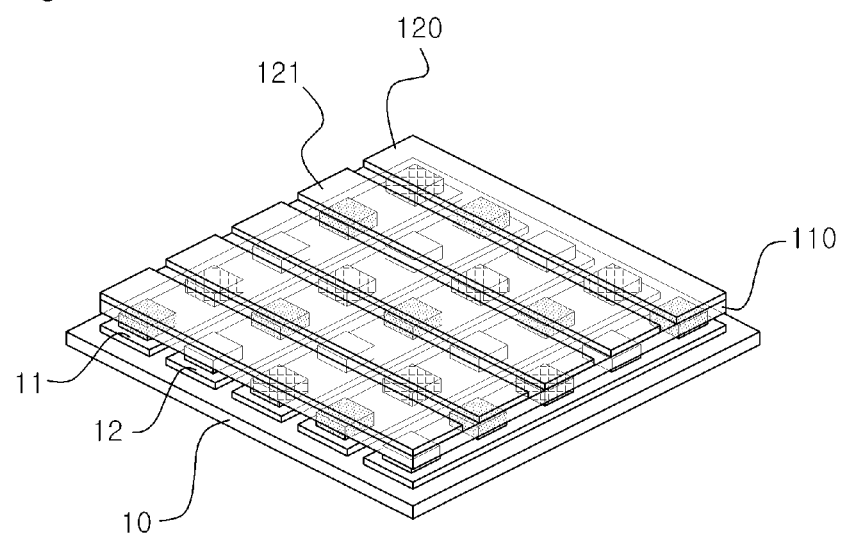
FIG. 12 is a perspective view for illustrating a step of forming a second electrode on the insulation layer of the present disclosure.

After that, as shown in FIG. 11, an insulation layer 110 may be formed on the substrate. Subsequently, as shown in FIG. 12, a plurality of second electrodes 120, 121 may be formed on the insulation layer 110. In addition, as described above, after Step 4), a step of forming a short wavelength penetration filter and a step of forming a long wavelength penetration filter may be further provided.

The LED display of the present disclosure manufactured according to the above method includes: 1) a plurality of first electrodes formed on a substrate; 2) at least one LED element among at least five subminiature blue, green and red LED elements attached to each unit pixel site formed on the first electrode; 3) an insulation layer formed on the substrate; and 4) a plurality of second electrodes formed on the insulation layer.

Figure 13:
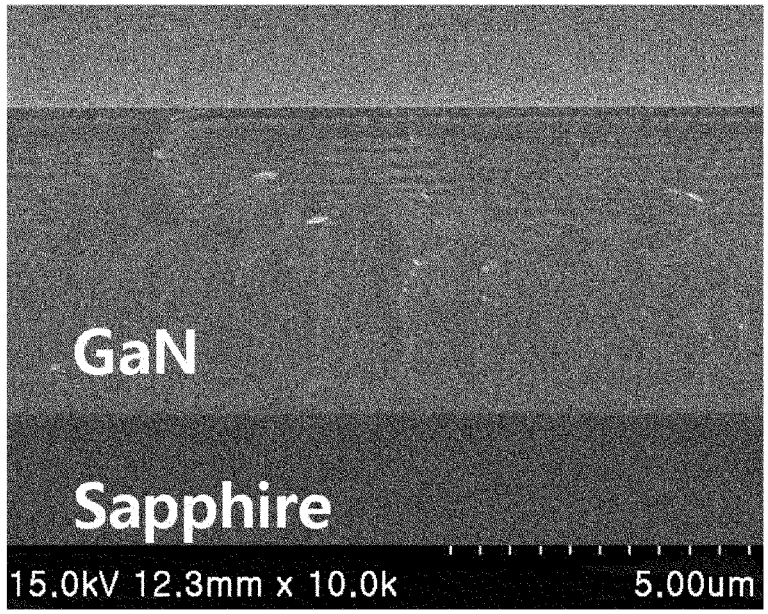
FIG. 13 is an electron microscope photograph showing a section of the LED basic element layer of the present disclosure.

Hereinafter, the present disclosure will be described in more detail based on examples, but the following examples are just for better understanding of the present disclosure but not intended to limit the scope of the present disclosure. In order to make an LED basic element layer (GaN), a buffer layer or undoped semiconductor layer (undoped GaN, 2.4 to 2.8 µm in thickness), a first conductive semiconductor layer (n-type GaN, 2.0 to 2.4 µm in thickness), an active layer (InGaN/GaN multiple quantum well, 100 to 140 nm), and a second conductive semiconductor layer (p-type GaN, 200 nm in thickness) were formed on a sapphire substrate (2-inch wafer size, 430±25 µm) by means of MOCVD (see FIG. 13).

Figure 14:
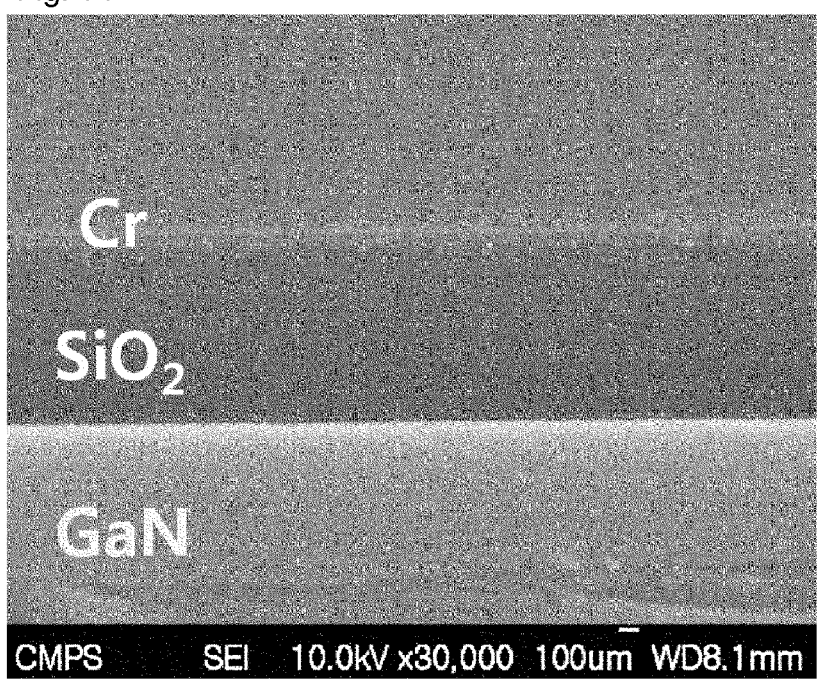
FIG. 14 is an electron microscope photograph showing sections of the present disclosure in which an insulation layer and a metal mask layer are formed on the second conductive semiconductor layer.
Figure 15A:
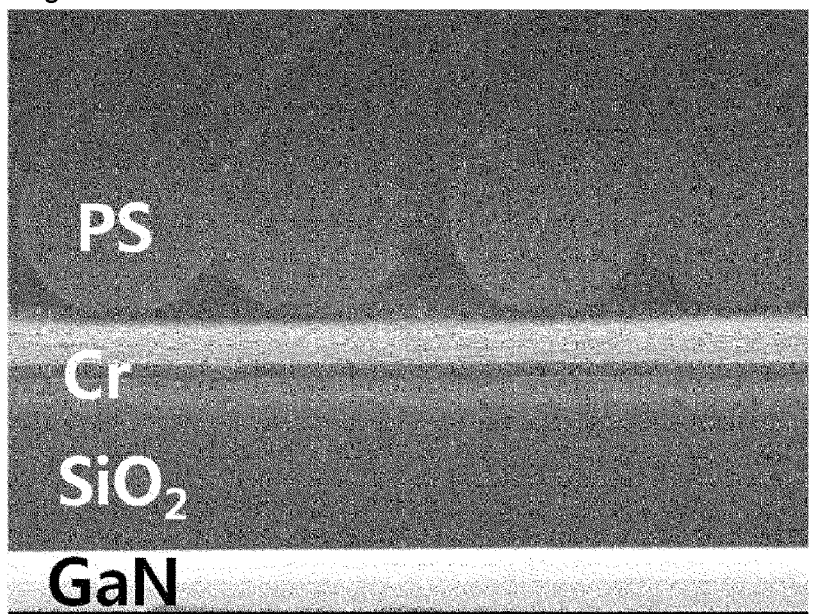
FIG. 15a is an electron microscope photograph showing a section of the present disclosure in which a nano-sphere monolayer is formed on the metal mask layer.
Figure 15B:
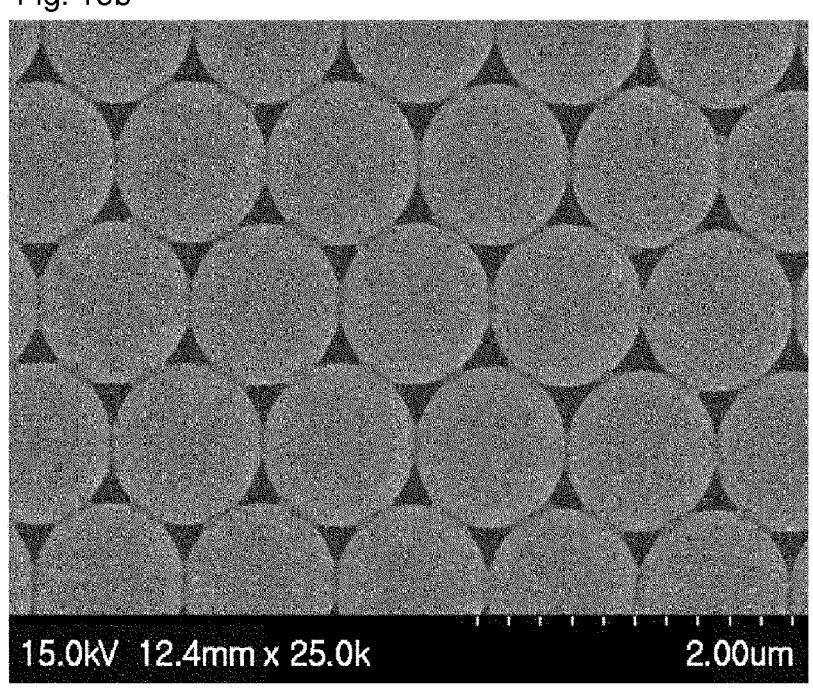
FIG. 15b is an electron microscope photograph showing a plane thereof.
Figure 16A:
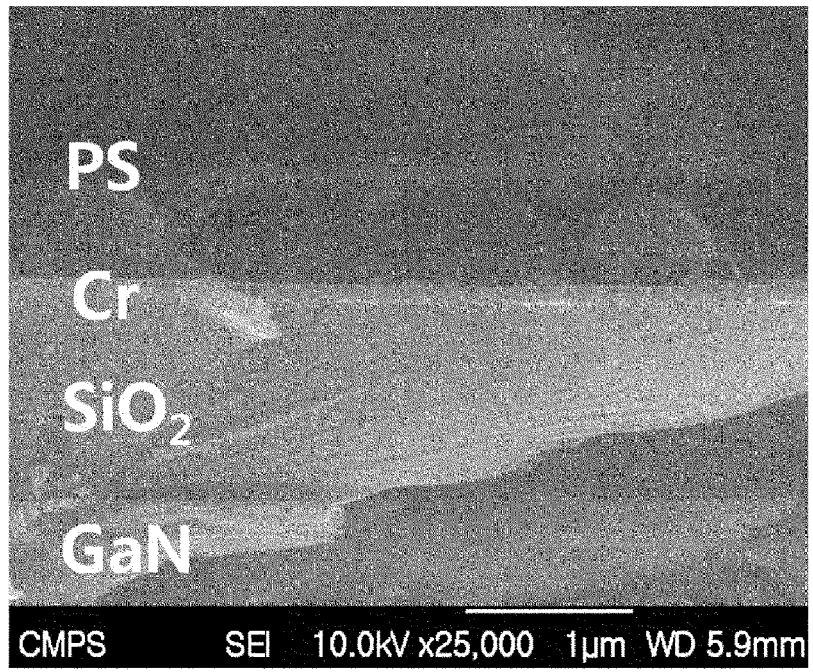
FIG. 16a is an electron microscope photograph showing a section of the present disclosure in which the nano-sphere monolayer has been ashed under an $O_2$ gas circumstance.
Figure 16B:
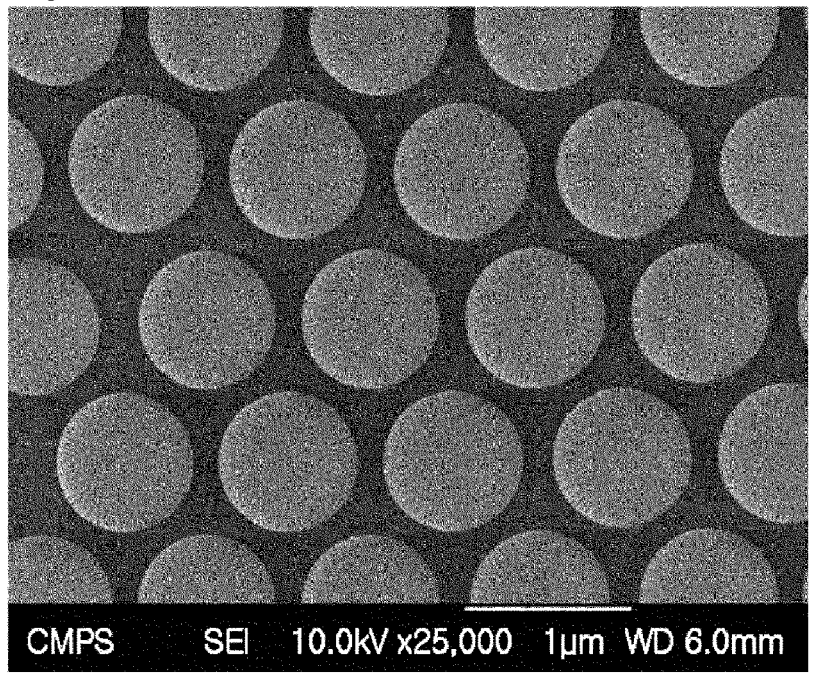
FIG. 16b is an electron microscope photograph showing a plane thereof.
Figure 17A:
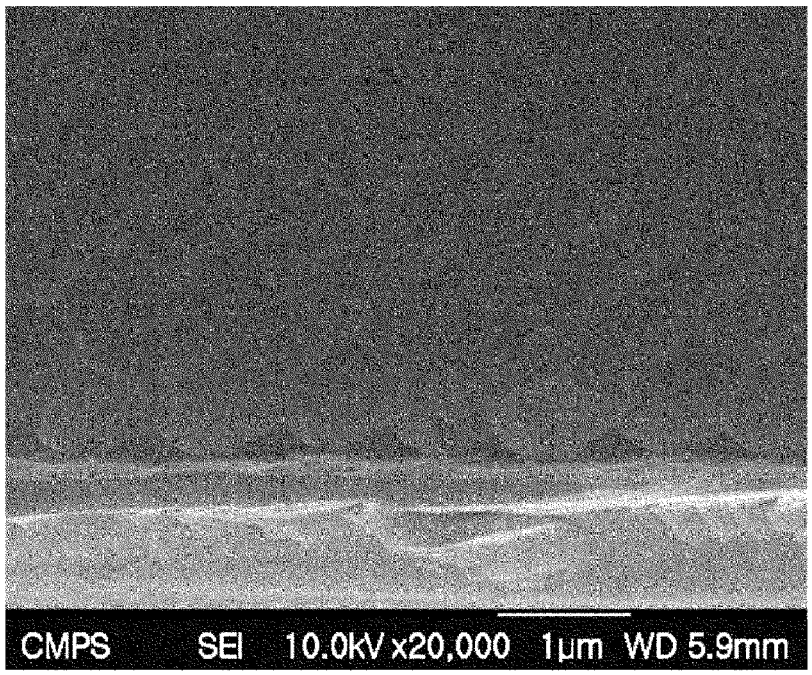
FIG. 17a is an electron microscope photograph showing a section of the present disclosure in which the metal mask layer has been etched under a $Cl_2$ gas circumstance while using a nano-sphere of a reduced size as a mask.
Figure 17B:
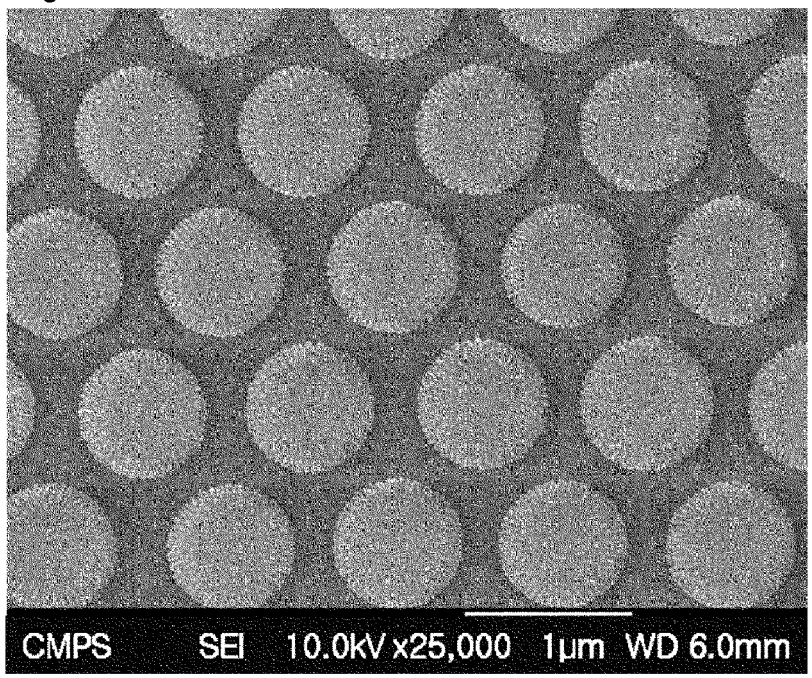
FIG. 17b is an electron microscope photograph showing a plane thereof.
Figure 18A:
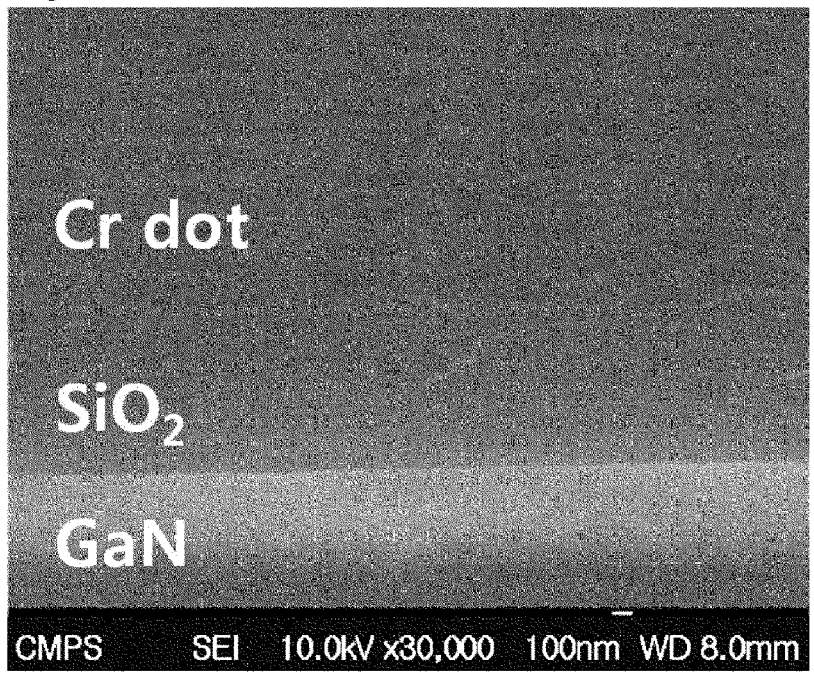
FIG. 18a is an electron microscope photograph showing a section of the metal mask layer pattern of the present disclosure, which has been transferred according to a shape of polystyrene by the etching process.
Figure 18B:
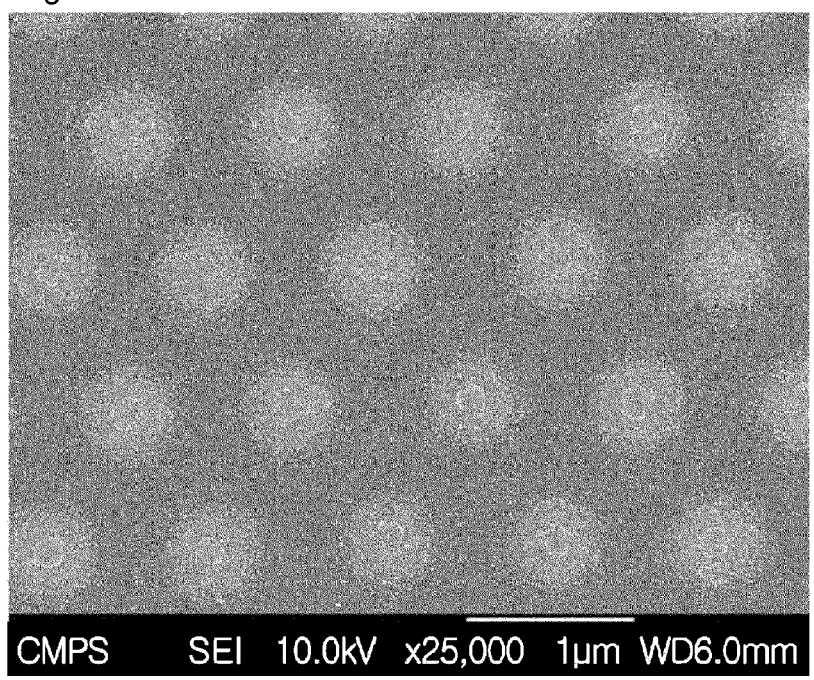
FIG. 18b is an electron microscope photograph showing a plane thereof.
Figure 19A:
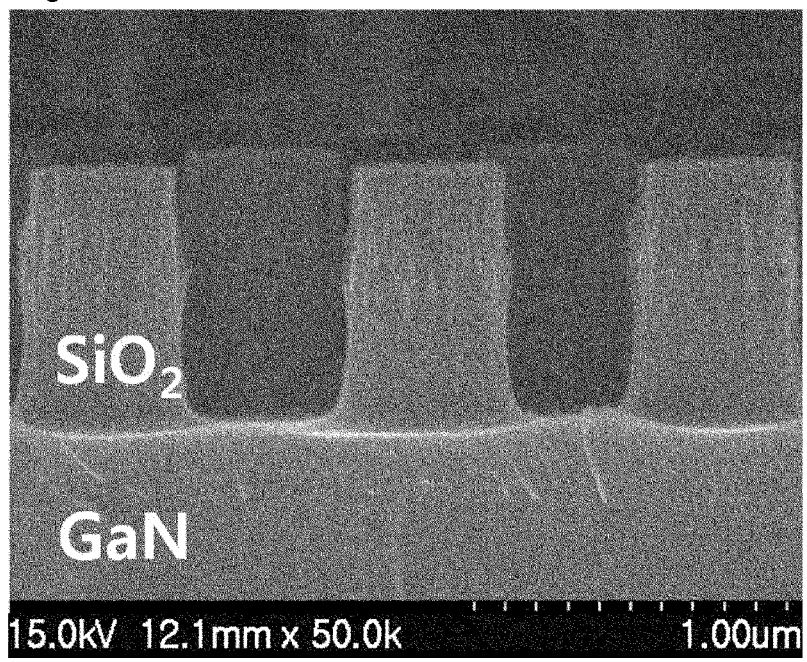
FIG. 19a is an electron microscope photograph showing a section of the present disclosure in which $SiO_2$ (the insulation layer) has been etched under a $CF_4$ and $O_2$ gas circumstance by using the metal mask layer pattern.
Figure 19B:
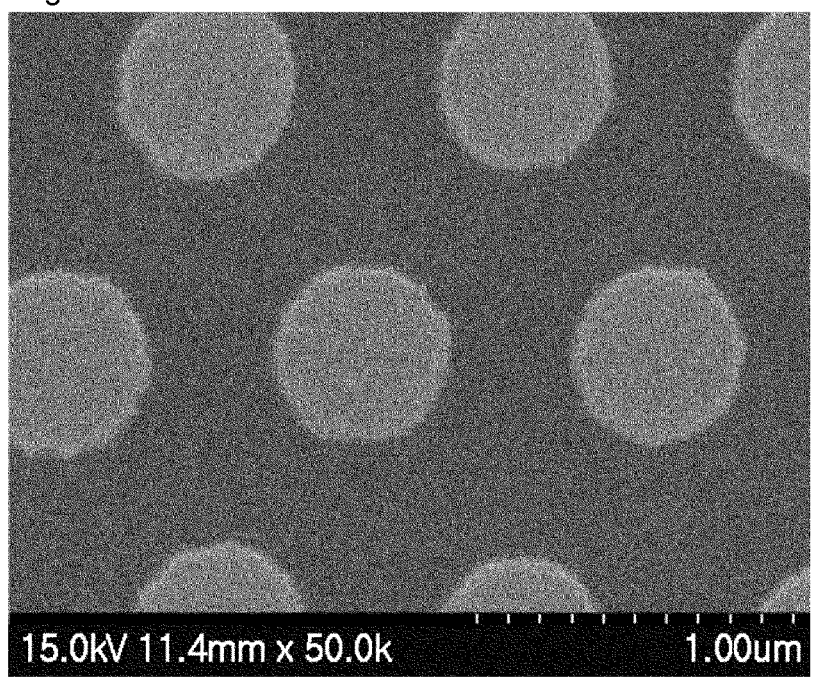
FIG. 19b is an electron microscope photograph showing a plane thereof.
Figure 20A:
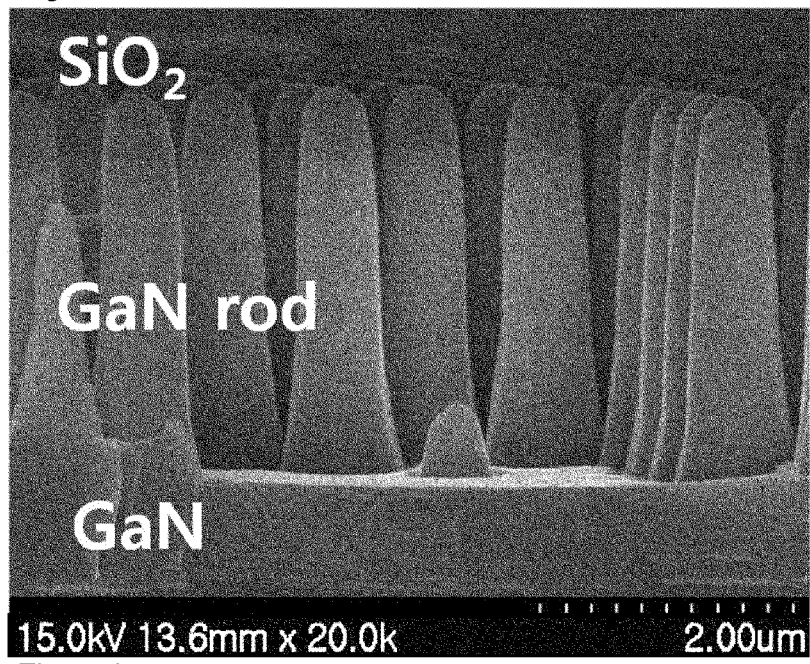
FIG. 20a is an electron microscope photograph showing a section of the present disclosure which has been etched under a $SiCl_4$ and Ar gas circumstance by means of inductively coupled plasma (ICP) by using the etched insulation layer.
Figure 20B:
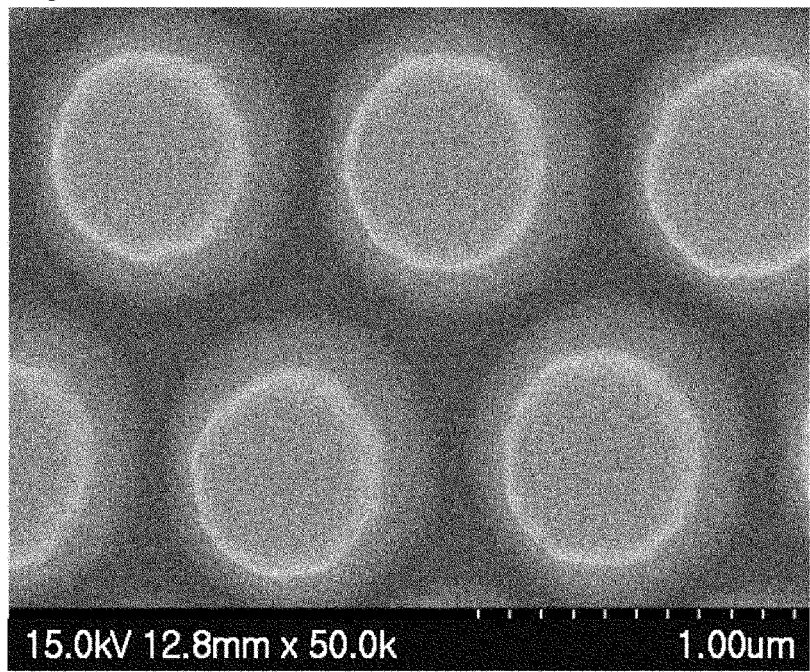
FIG. 20b is an electron microscope photograph showing a plane thereof.
Figure 21A:
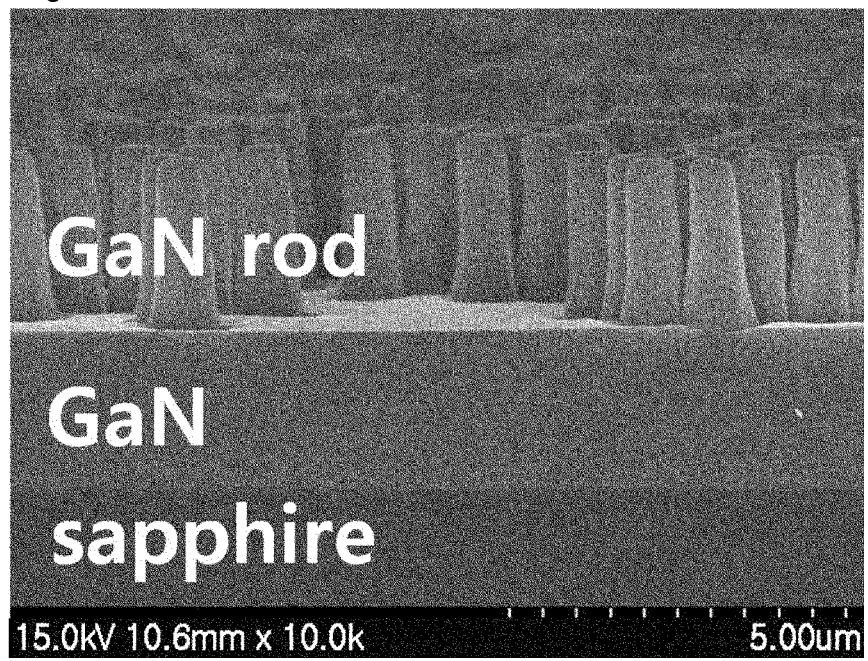
FIG. 21a is an electron microscope photograph showing a section of the present disclosure after the insulation layer used as a mask is removed.
Figure 21B:
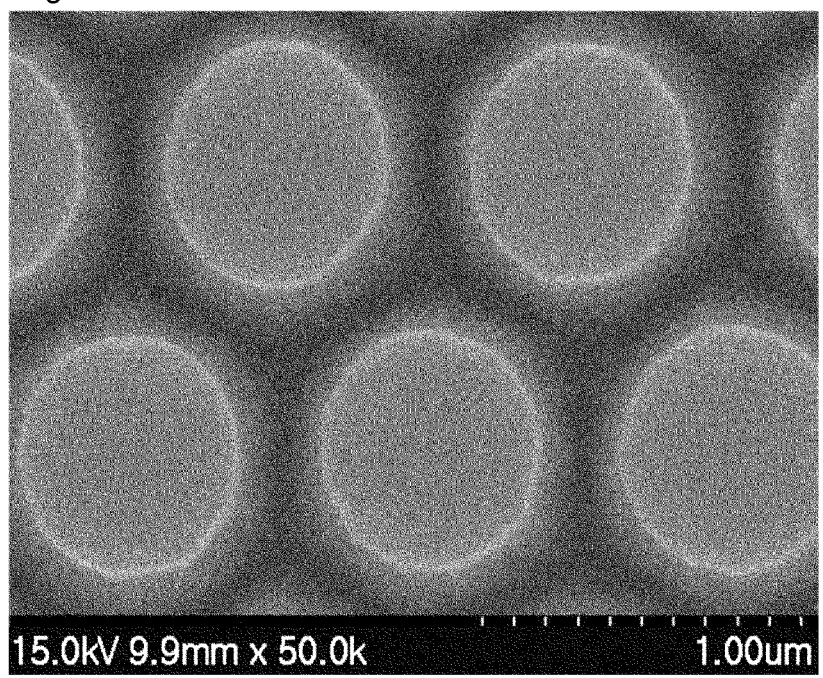
FIG. 21b is an electron microscope photograph showing a plane thereof.

By using the above LED basic element layer, a subminiature LED element was prepared according to the following process. First, $SiO_2$ (800 nm to 1 µm in thickness) serving as an insulation layer and a chrome layer (100 to 120 nm in thickness) serving as a metal mask layer were formed on the second conductive semiconductor layer by means of PECVD and thermal evaporation, respectively (PECVD: 60 W, 550 mtorr, $SiH_4$ 160 sccm, $N_2$ 240 sccm, $N_2O$ 1500 sccm, 35 to 40 minutes; thermal evaporation: 130 to 140 A, $9.0 \times 10^{-6}$ torr, 20 to 30 minutes) (see FIG. 14). Subsequently, a polystyrene nano-sphere was prepared as a monolayer (960 to 1000 nm in thickness) agreeably arranged in a hexagonal shape and formed on the metal mask layer (see FIGS. 15a and 15b). The monolayer was ashed (50 W, 0.05 torr, $O_2$ 100 sccm) under an $O_2$ gas circumstance to have a reduced size of 500 to 800 nm (see FIGS. 16a and 16b). The polystyrene nano-sphere having a reduced size was used as a mask, and the metal mask layer was etched under a $Cl_2$ gas circumstance by means of RIE which is a dry etching method (50 W, 0.08 torr, $Cl_2$ 40 sccm) (see FIGS. 17a and 17b). By the etching process, a metal mask layer pattern transferred according to the shape of polystyrene was prepared (see FIGS. 18a and 18b), and by using the prepared metal mask layer pattern, the insulation layer region present at a lower portion was etched again under a $CF_4$ and $O_2$ gas circumstance (100 W, 0.042 torr, $CF_4$ 40 sccm, $O_2$ 2 sccm) (see FIGS. 19a and 19b). By using the insulation layer etched into a rod pattern, the semiconductor layer (GaN) was etched under a $SiCl_4$ and Ar gas circumstance by means of ICP (RF 50 W, ICP 300 W, 3 torr, $SiCl_4$ 2 sccm, Ar 20 sccm), thereby making a rod pattern of the semiconductor layer (see FIGS. 20a and 20b). Subsequently, the insulation layer used as a mask in order to make the rod pattern of the semiconductor layer was removed by etching under a $CF_4$ and $O_2$ gas circumstance (see FIGS. 21a and 21b).

Figure 22A:
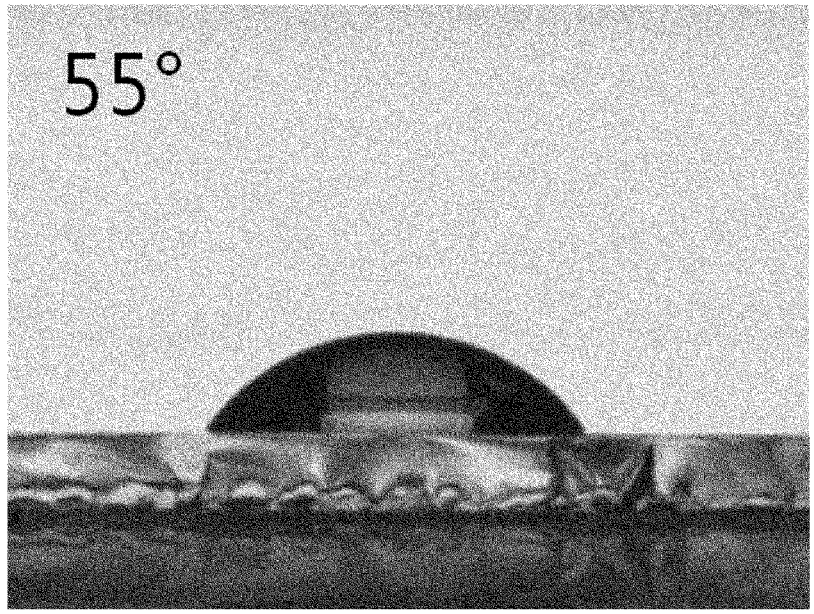
FIGS. 22a and 22b are diagrams showing contact angles measured before (22a) and after (22b) coating the semiconductor layer having an insulation coating ($Al_2O_3$) with a hydrophobic coating (octadecyltrichlorosilane (OTS)) according to the present disclosure.
Figure 22B:
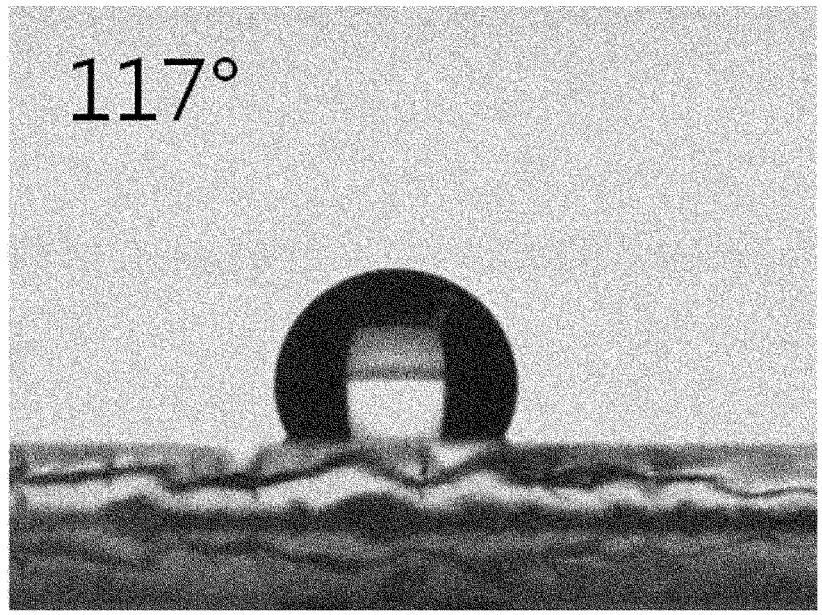
Figure 23A:
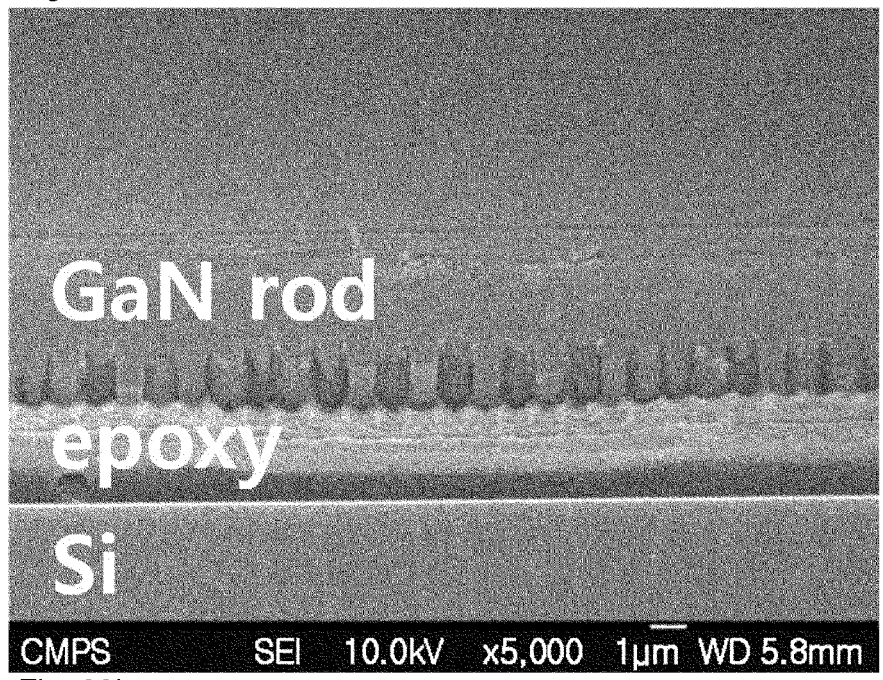
FIGS. 23a and 23b are electron microscope photographs showing a section of the present disclosure in which a lift-off process is performed toward a buffer layer to which a support film is not attached or toward an undoped semiconductor layer and a sapphire substrate.
Figure 23B:
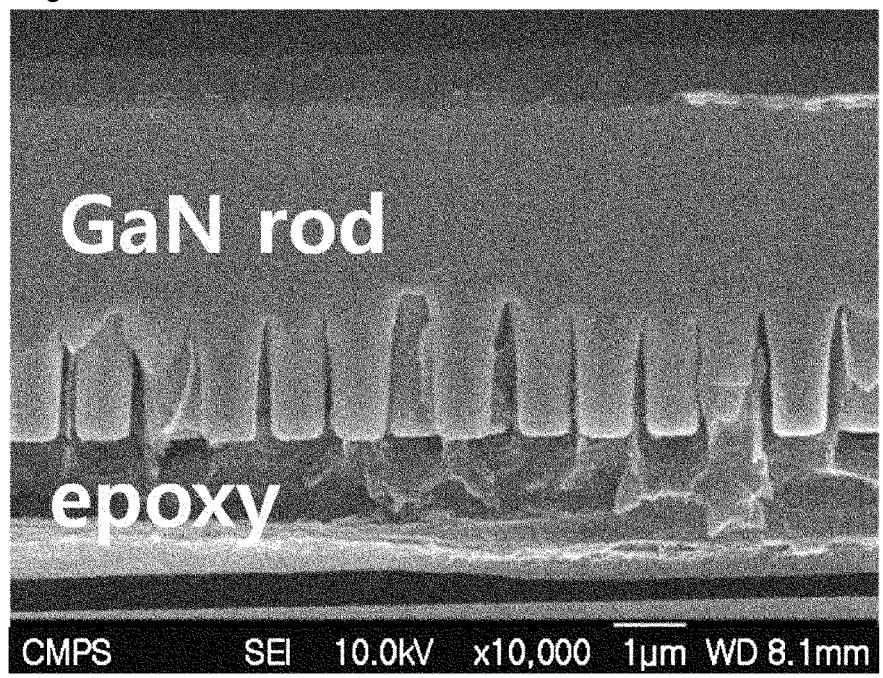
Figure 24A:
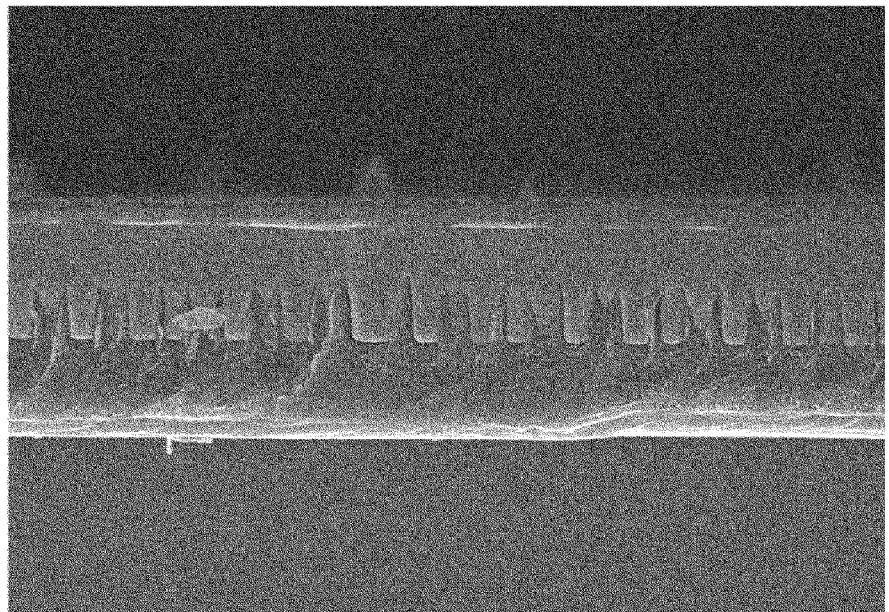
FIGS. 24a and 24b are electron microscope photographs showing a section of the present disclosure in which the buffer layer or the undoped semiconductor layer is further etched by means of ICP to expose the first conductive semiconductor layer.
Figure 24B:
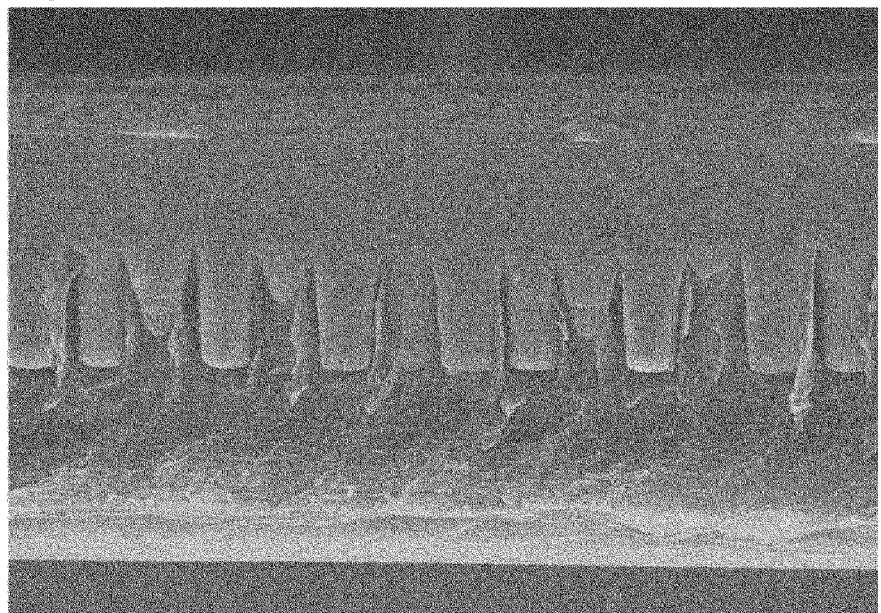
Figure 25A:
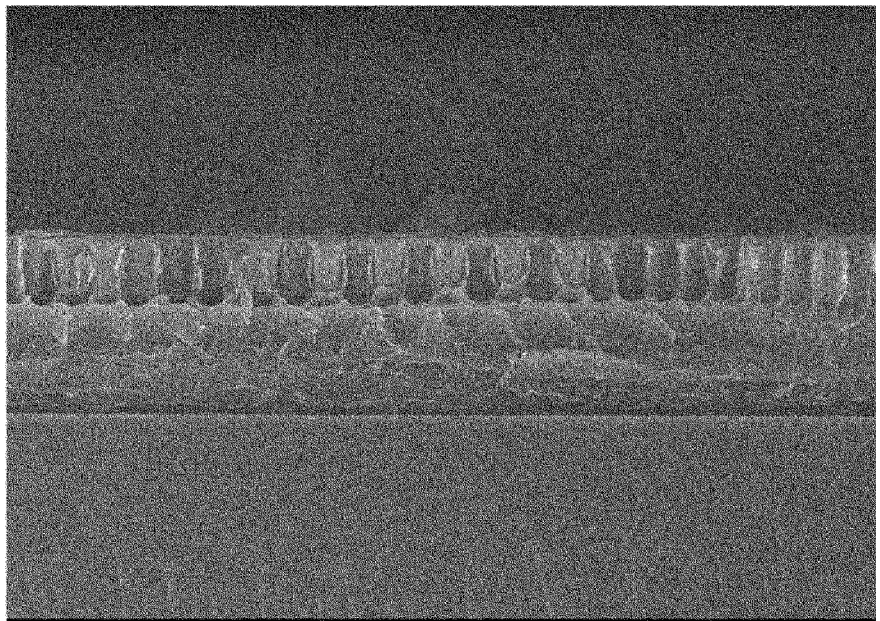
FIGS. 25a and 25b are electron microscope photographs showing a section of the present disclosure in which etching is further performed by means of ICP.
Figure 25B:
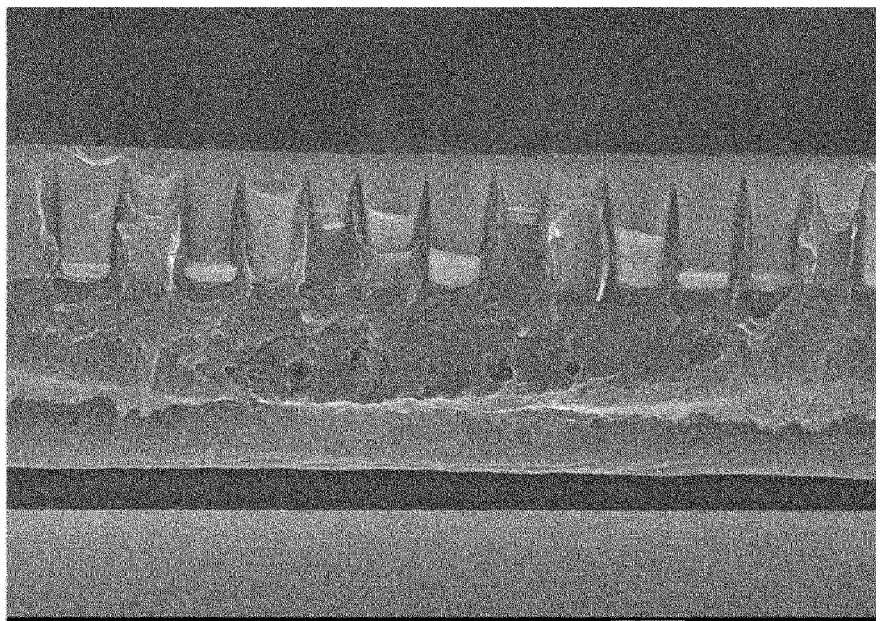
Figure 26A:
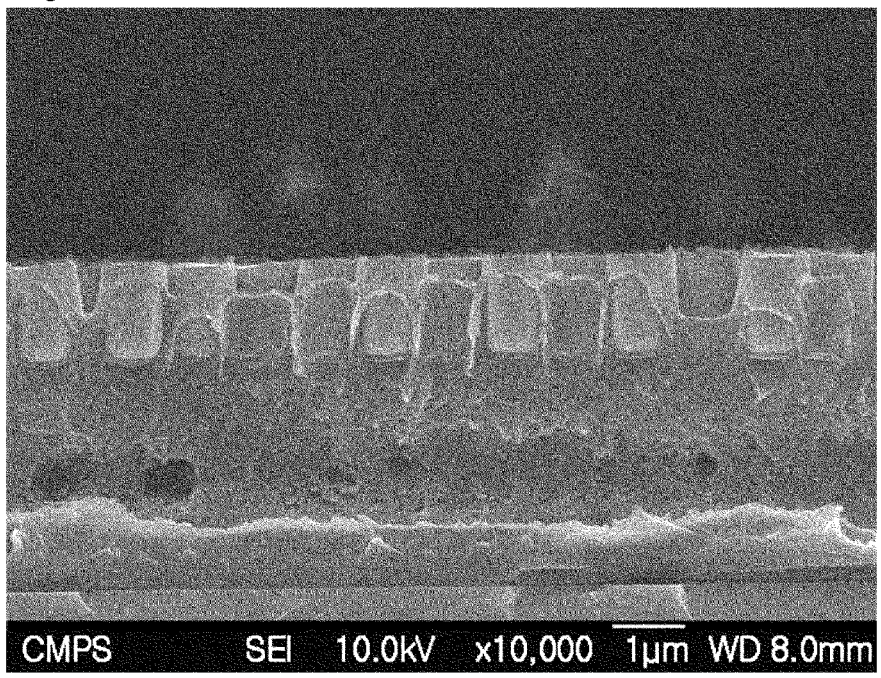
FIG. 26a is an electron microscope photograph showing a section of the present disclosure in which etching is performed by means of ICP to expose the first conductive semiconductor layer.
Figure 26B:
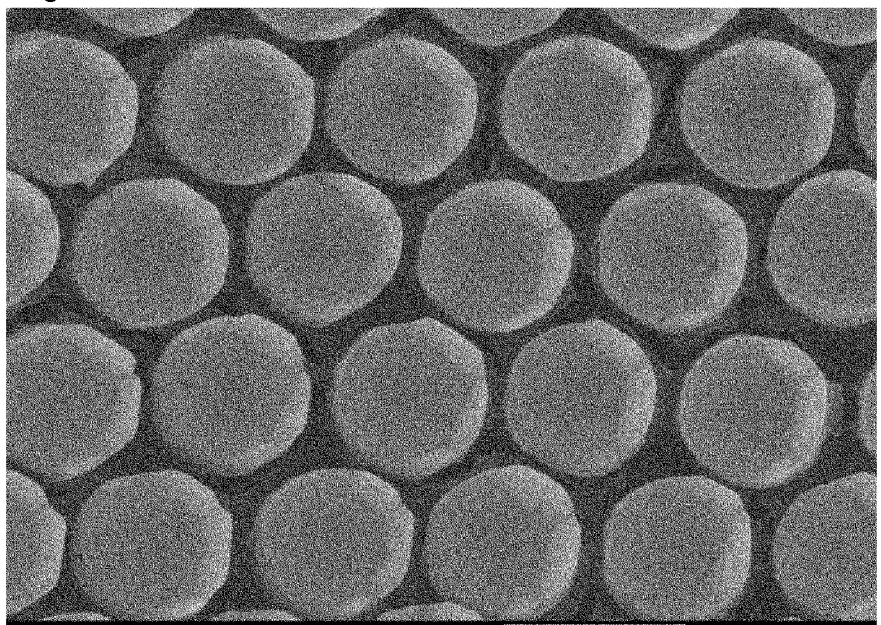
FIG. 26b is an electron microscope photograph showing a plane thereof.

The outer circumference of the semiconductor layer prepared as above was coated with an insulation coating ($Al_2O_3$) by means of atomic layer deposition (ALD) (trimethylaluminum (TMA) was used as a metal reactant material, steam was used as an oxygen source, TMA vapor pressure was 0.04 torr, a chamber temperature was maintained to be 80° C., Ar was used as a carrier gas and a purging gas, and a growth rate was ~1.5 Å) (thickness: 20 nm), and was also coated with octadecyltrichlorosilane (OTS) as a hydrophobic coating by means of a self-assembling process to have a thickness of several nanometers. Referring to FIGS. 22a and 22b, it may be found that a contact angle with water increases due to the hydrophobic coating. After the insulation coating and the hydrophobic coating are formed, a support film was attached onto the second electrode layer by using an epoxy resin (cyanoacrylate adhesive metal-type, purchased from Sigma Aldrich) (thickness: 3.5 to 5 μm). Subsequently, a lift-off process using laser was performed toward the buffer layer to which a support film is not formed, or the undoped semiconductor layer and the sapphire substrate to remove the sapphire substrate (see FIGS. 23a and 23b). In order to expose the first conductive semiconductor layer, the buffer layer or the undoped semiconductor layer was removed by etching by means of ICP under a $SiCl_4$ and Ar gas circumstance (RF 50 W, ICP 300 W, 3 torr, $SiCl_4$ 2 sccm, Ar 20 sccm). By doing so, an independent subminiature LED rod pattern to which the support film was attached may be obtained (see FIGS. 24a and 24b, FIGS. 25a and 25b, and FIGS. 26a and 26b).

Figure 27:
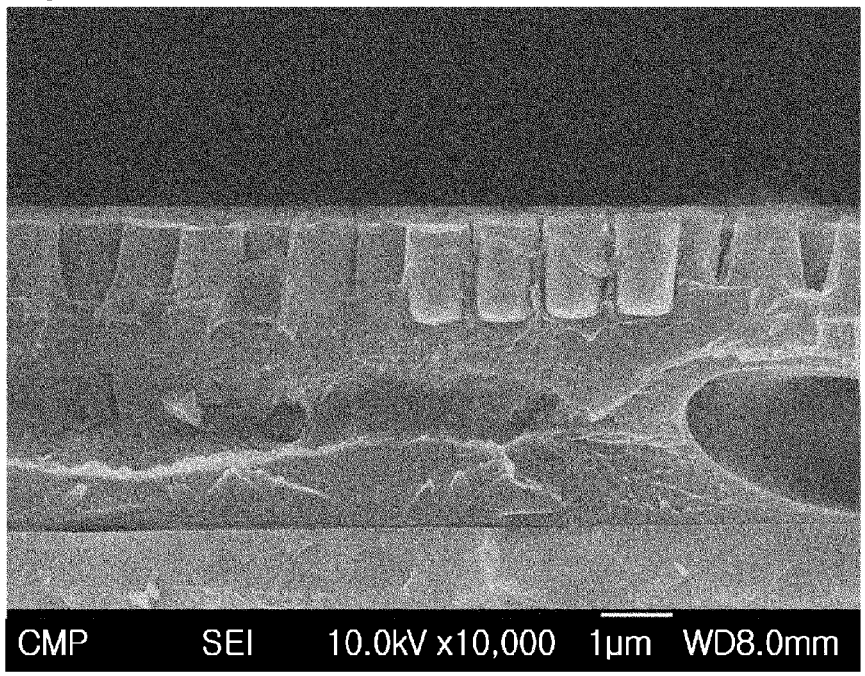
FIG. 27 is an electron microscope photograph showing a section of the present disclosure in which an electrode (Ti) is deposited to the first conductive semiconductor layer of the subminiature LED by means of sputtering.
Figure 28:
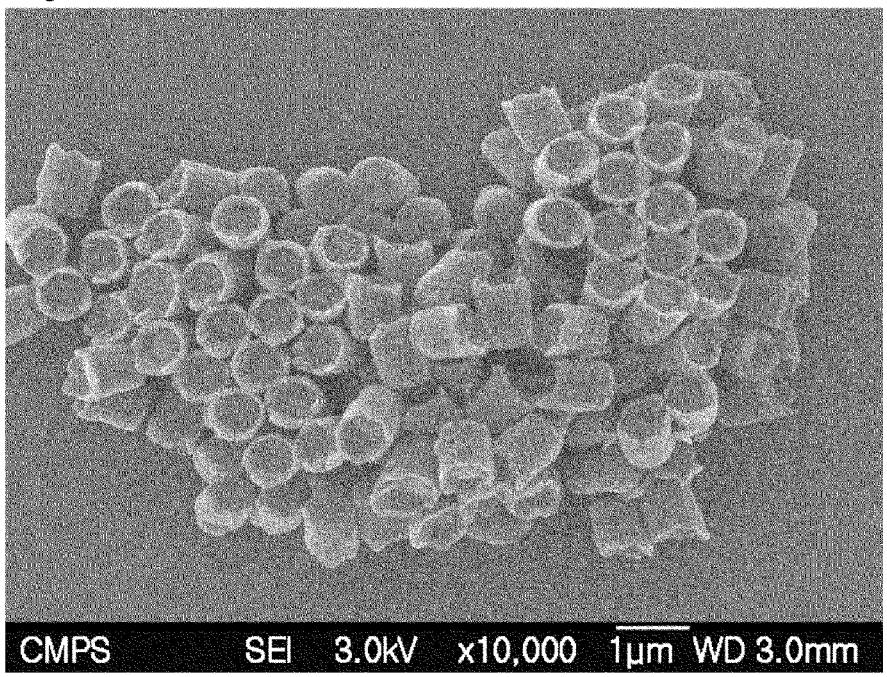
FIG. 28 is an electron microscope photograph showing a subminiature LED in an independent state after removing the support film with acetone according to the present disclosure.
Figure 29:
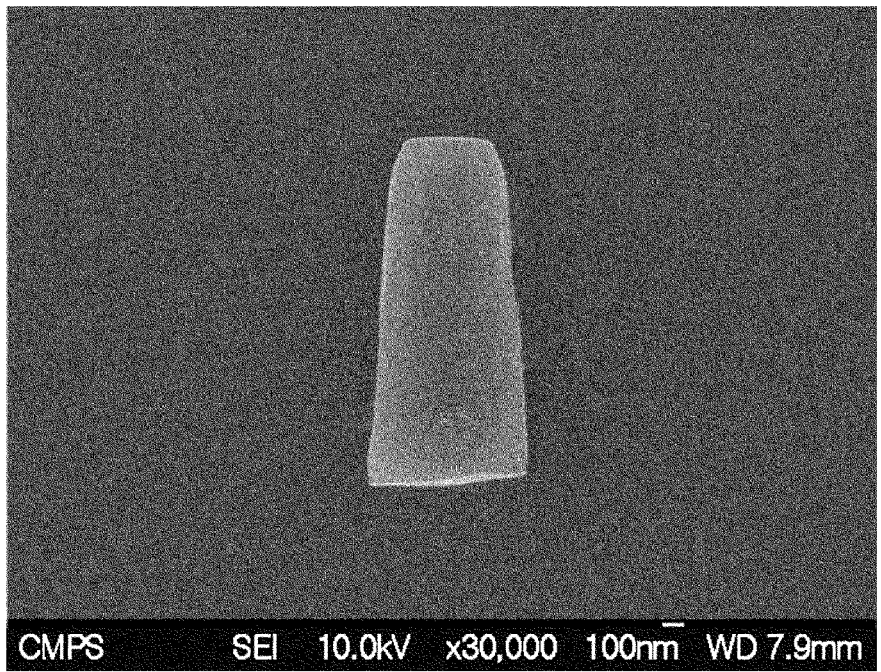
FIG. 29 is an electron microscope photograph showing a single independent subminiature LED of FIG. 28.
Figure 30:
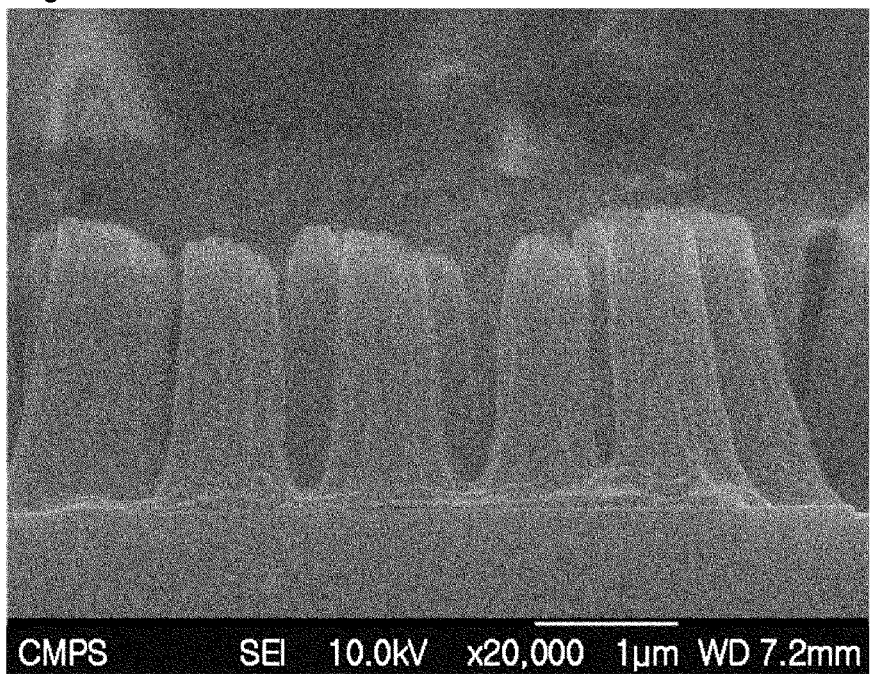
FIG. 30 is an electron microscope photograph showing that independent subminiature LED elements of FIG. 28 are arranged on an electrode substrate.
Figure 31:
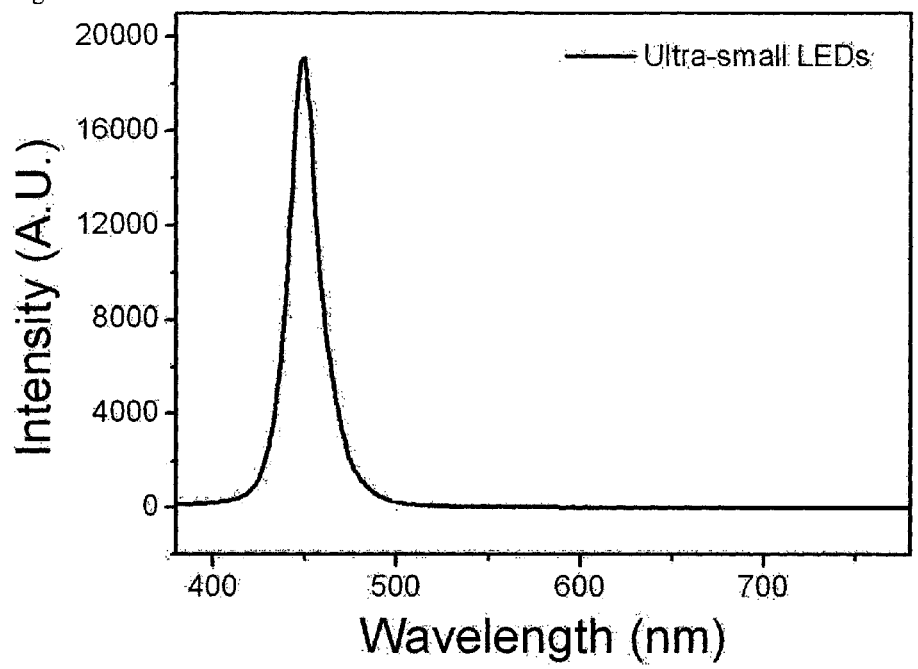
FIG. 31 shows a spectrum measured after the subminiature LED elements of the present disclosure are arranged on the electrode substrate.
Figure 32A:
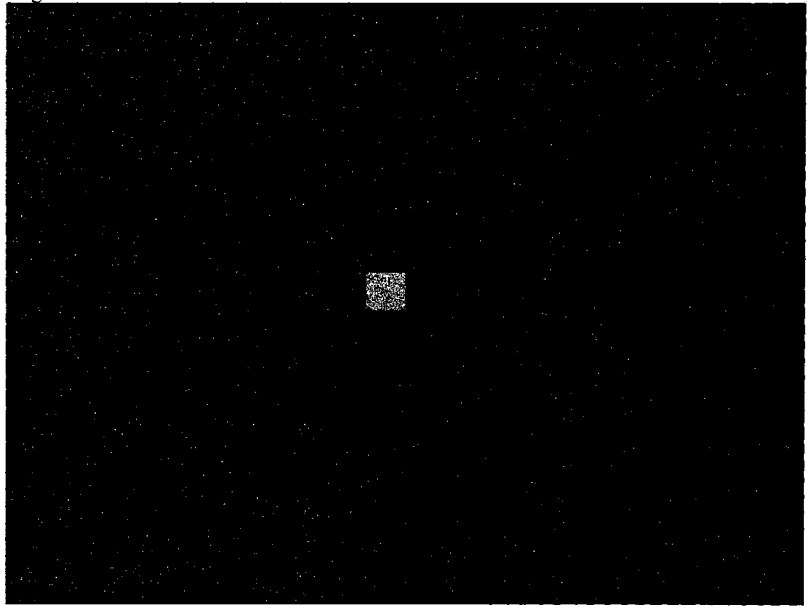
FIGS. 32a to 32c are photographs observed by naked eyes, showing that the subminiature LED of the present disclosure emits light in blue.
Figure 32B:
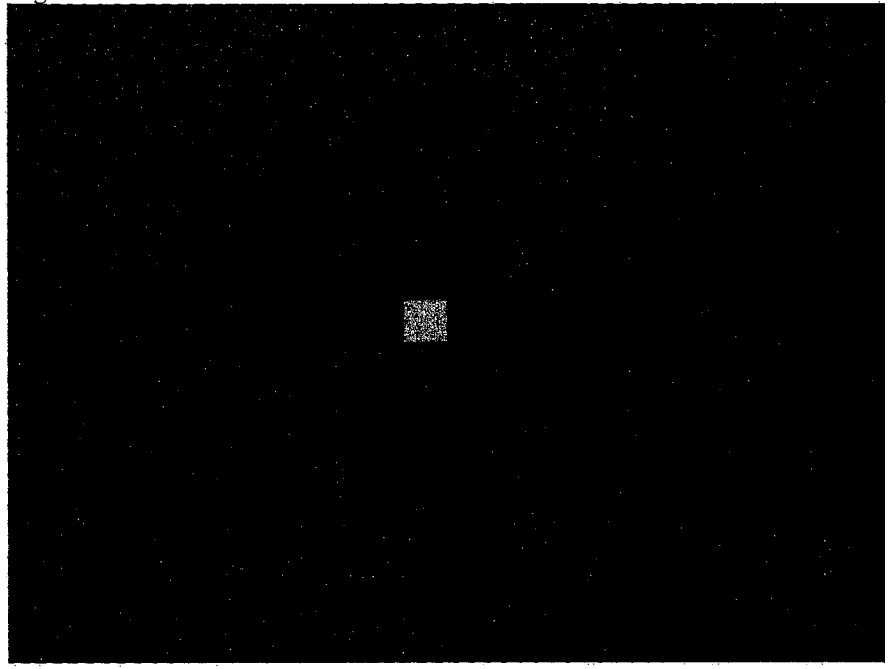
Figure 32C:
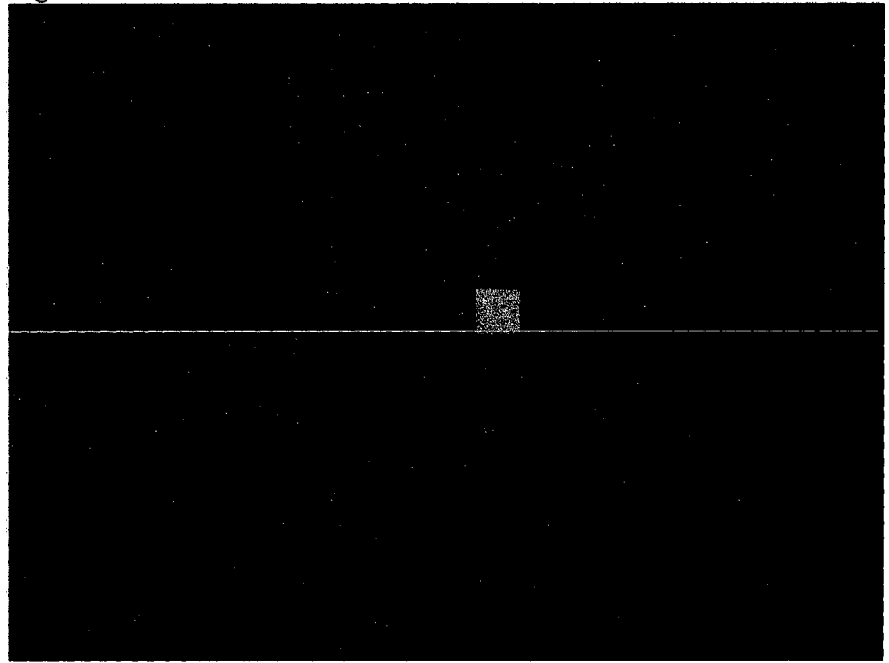

Subsequently, a Ti electrode was deposited to the first conductive semiconductor layer of the subminiature LED by using a sputtering device (DC-sputtering system) (300V, 0.17 A, Ar 100 sccm) (see FIG. 27). Next, the electrode surface was coated with dithiol as a coupling linker by means of liquid or vapor self-assembling. The coating process was performed in a liquid state. In addition, 1 mM of nonamedithiol solution was prepared by mixing ethanol anhydride (10 ml) and nonamedithiol (20 μl), and the subminiature LED rod shape to which the electrode was deposited was dipped in the nonamedithiol solution for a day and then taken out and washed. The support film was removed by using acetone so that independent subminiature LEDs are prepared in an ink or paste form (see FIGS. 28 and 29). The ink or paste form was arranged by being dropped onto an electrode substrate having a linker (metal micro powder: silver nanoparticles) which reacts with the coupling linker. In regard of the electrode substrate, a pattern was formed by using a dithiol linker reacting with the electrode substrate and silver nanoparticles serving as the metal micro powder capable of reacting with the coupling linker of the subminiature LED. In detail, the nonamedithiol linker was firstly attached to the electrode substrate by reaction, and an opposite side of the nonamedithiol linker not attached to the electrode substrate was coated with silver nanoparticles. The coating process was performed by putting the electrode substrate attached to the nonamedithiol linker into a toluene solution in which silver nanoparticles are dispersed, and then taking out the same after reaction. By doing so, the metal micro powder of the electrode substrate was reacted with the coupling linker of the subminiature LED, and then a metallic ohmic layer was formed through a soldering process (annealing at 100 to 200° C.), thereby manufacturing the subminiature LED element according to the present disclosure (see FIG. 30). Meanwhile, FIG. 31 shows a spectrum measured after the subminiature LED elements prepared as above are arranged on the electrode substrate, and FIGS. 32a to 32c are photographs observed by naked eyes, showing that the manufactured subminiature LED elements. As shown in these figures, it may be found that a blue light is emitted from the manufactured subminiature LED element. Meanwhile, the LED element employed in the full-color LED display device according to the present disclosure may use single-type subminiature LED elements, or a subminiature LED element bundle obtained by binding them.

Figure 33:
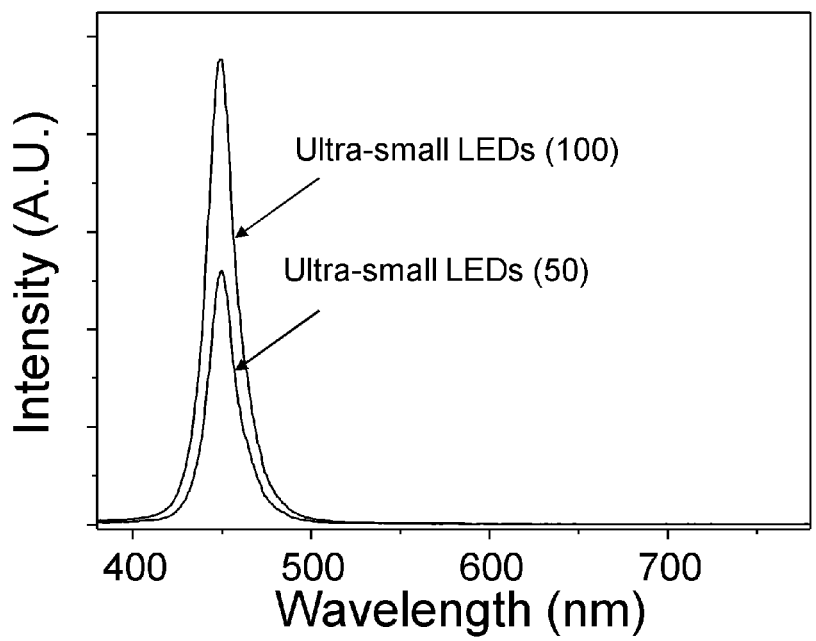
FIG. 33 is a diagram showing a blue light emission peak measured when fifty subminiature LED elements of the present disclosure are attached and when one hundred subminiature LED elements are attached.

By using the manufactured subminiature LED elements or the manufactured subminiature LED element bundle, a plurality of blue LED elements (in a paste or ink form) (in two modes of fifty elements and one hundred elements) was attached to unit pixel sites formed on the first electrode used as a lower electrode (pixel arrangement: 4×4 square arrangement, 20 μm×20 μm). FIG. 33 shows a blue light emission peak measured when fifty subminiature LED elements are attached and when one hundred subminiature LED elements are attached. Referring to FIG. 33, it may be understood that a blue light of higher intensity is emitted in the case where fifty subminiature LED elements are attached, rather than the case where one hundred subminiature LED elements are attached. A dithiol coupling linker was formed at the surface of every unit pixel site. In detail, after ethanol anhydride (10 ml) and nonamedithiol (20 μl) were mixed to prepare 1 mM of nonamedithiol solution, the first electrode was dipped in the prepared nonamedithiol solution for a day. Subsequently, the first electrode was taken out and washed, and then only the unit pixel sites on the first electrode were patterned by means of photolithography for the reaction with nonamedithiol. For the photolithography, the first electrode was coated with AZ1512 photoresist (AZ Electronic Materials) by means of spin coating, and then pixels were patterned through soft baking (95° C., 1 minute), UV exposure (for 90 seconds by using a mask where unit pixels are patterned) and development (AZ300 developer, AZ Electronic Materials, dipped for 1 minute and then taken out and washed). After pixels are patterned on the first electrode and react with nonamedithiol in this way, the patterned photoresist was removed by using acetone (the lift-off method), thereby forming nonamedithiol coupling linkers only at the unit pixel sites formed on the first electrode.

The formed coupling linkers were coated with silver nanoparticles (7 to 20 nm) as metal micro powder and attached to the coupling linkers formed at the plurality of subminiature blue LED elements. A soldering process (annealing at 100 to 200° C.) was performed to the metal micro powder between the attached LED elements and the first electrode to form a metallic ohmic layer between the subminiature LED elements and the pixel sites, and by doing so, the plurality of subminiature LED elements were arranged on the electrode.

An insulation layer (2.5 to 3.0 μm in thickness) made of SU-8 (Microchem) was formed on the subminiature LED element by means of spinning (5 seconds at 500 rpm, 30 seconds at 2000 rpm), and in order to deposit an ITO electrode as a second electrode onto the subminiature LED element, the insulation layer was removed to expose the LED element by means of ashing (power 50 W, working pressure 0.05 torr, $O_2$ 100 sccm). If the LED element is exposed, a second electrode was formed thereon by means of sputtering (rf-magnetron sputtering system, rf-power 30 W, working pressure $7.8 \times 10^{-3}$ torr, Ar 70 sccm, 100° C.) (the first electrodes and the second electrodes are formed in a stripe shape to cross each other).

Figure 34:
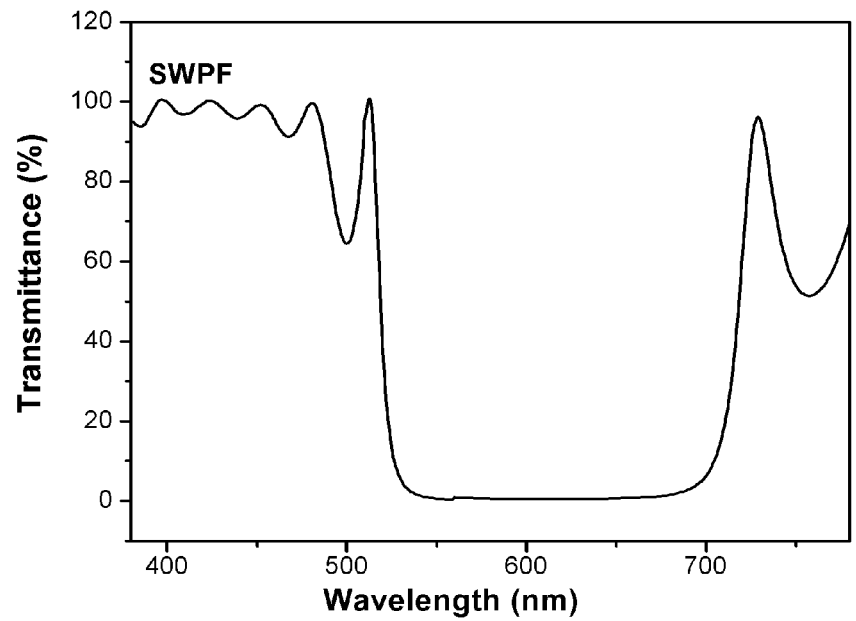
FIG. 34 is a diagram showing transmittance of the short wavelength penetration filter of the present disclosure.
Figure 35:
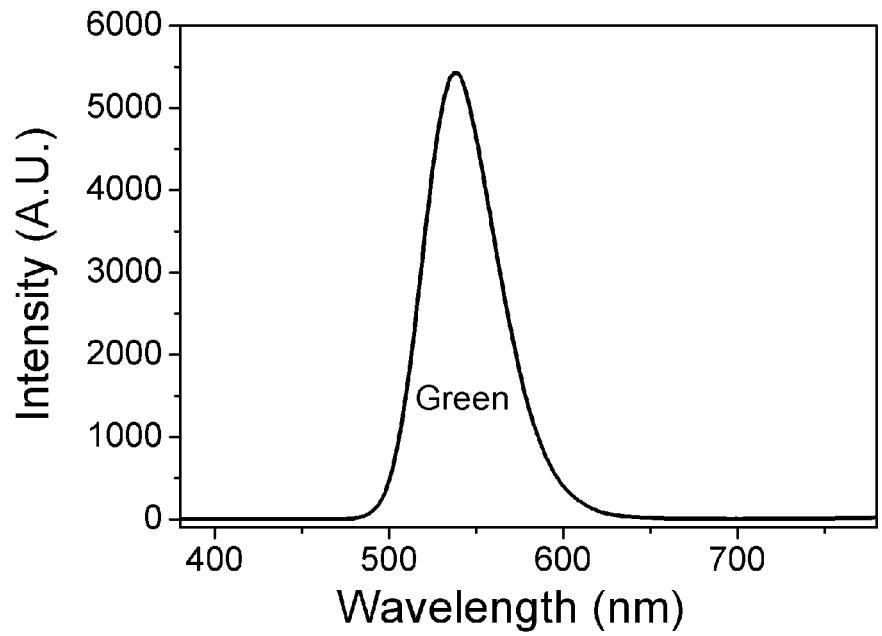
FIG. 35 is a diagram showing a light emission peak of the green color conversion layer of the present disclosure.
Figure 36:
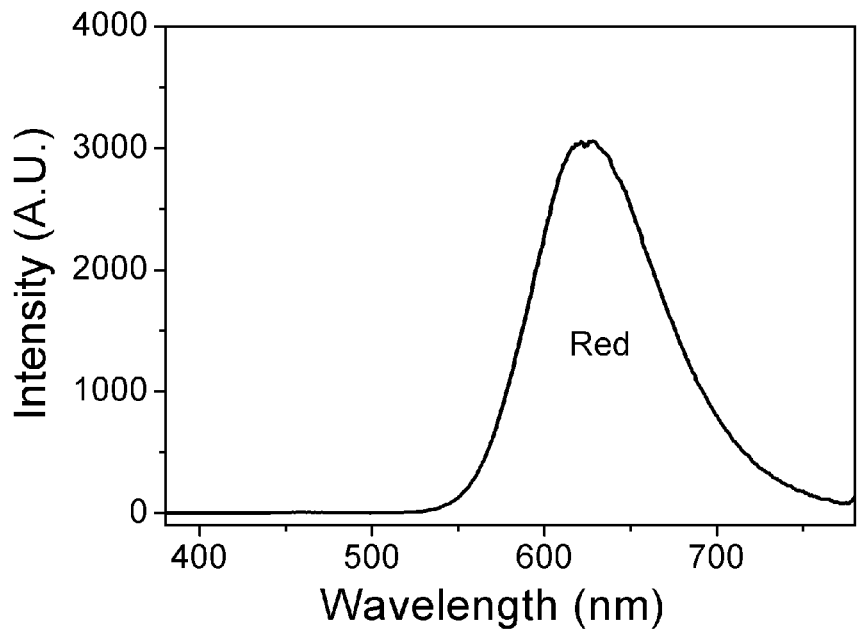
FIG. 36 is a diagram showing a light emission peak of the red color conversion layer of the present disclosure.
Figure 37:
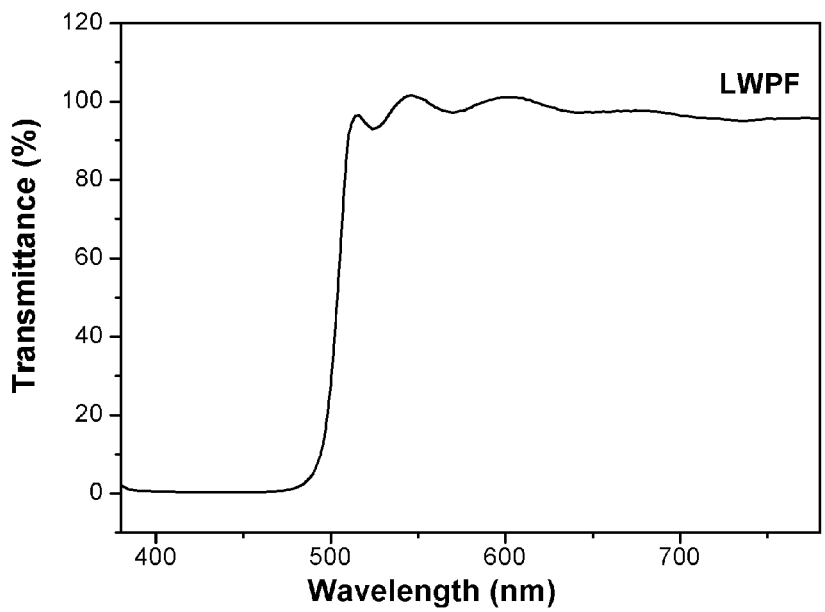
FIG. 37 is a diagram showing transmittance of the long wavelength penetration filter of the present disclosure.
Figure 38:
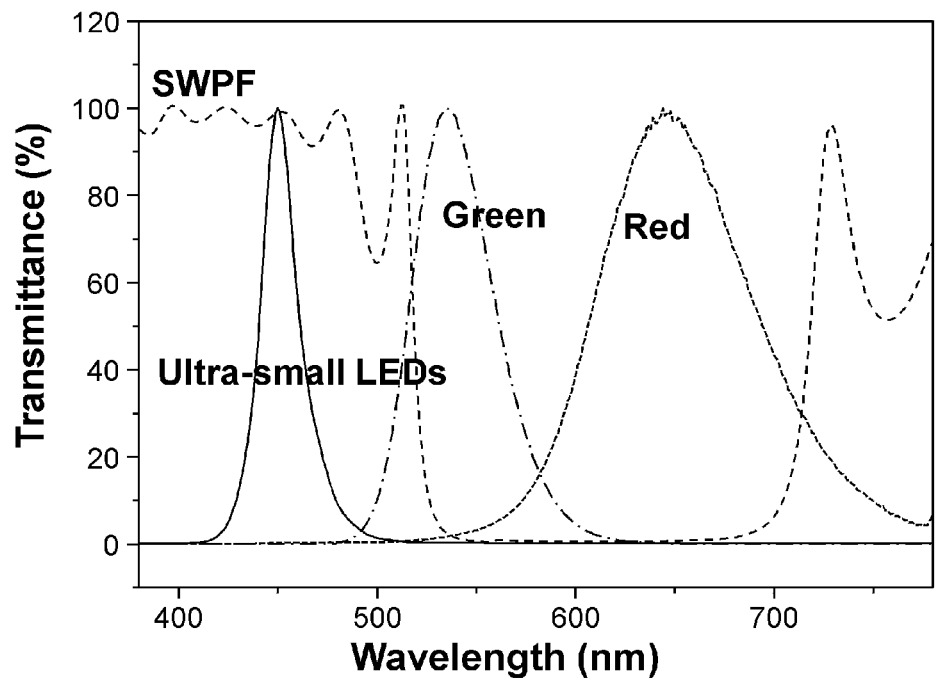
FIG. 38 is a diagram respectively showing transmittance of the short wavelength penetration filter of the present disclosure, a blue light emission peak of the standardized subminiature LED element, and light emission peaks of the green and red color conversion layers.
Figure 39:
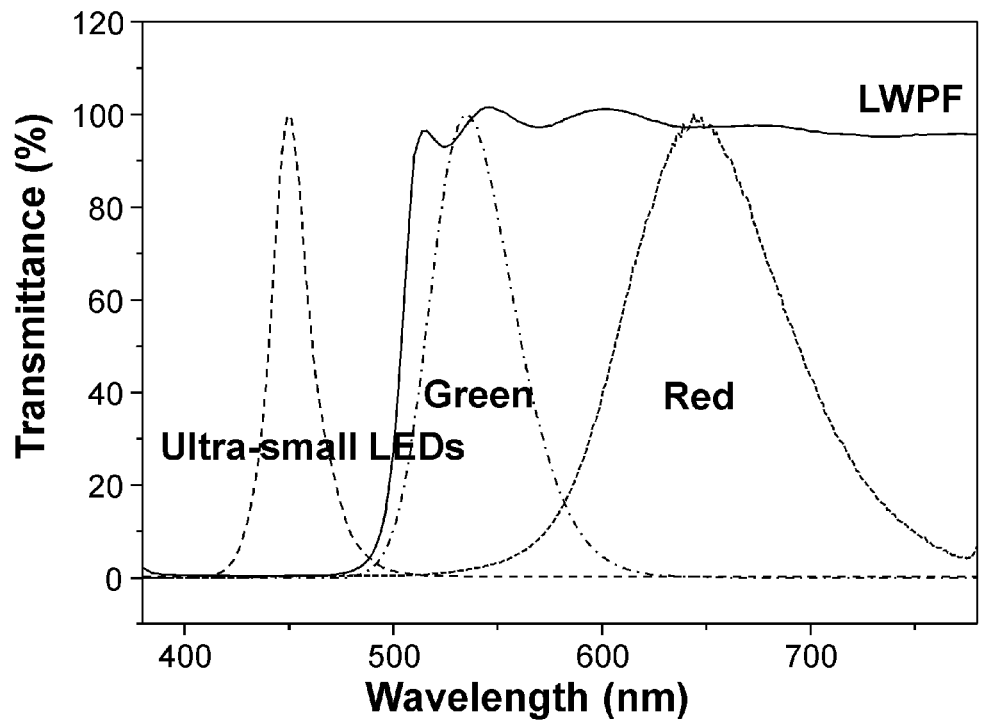
FIG. 39 is a diagram respectively showing transmittance of the long wavelength penetration filter of the present disclosure, a blue light emission peak of the standardized subminiature LED element, and light emission peaks of the green and red color conversion layers.
Figure 40:
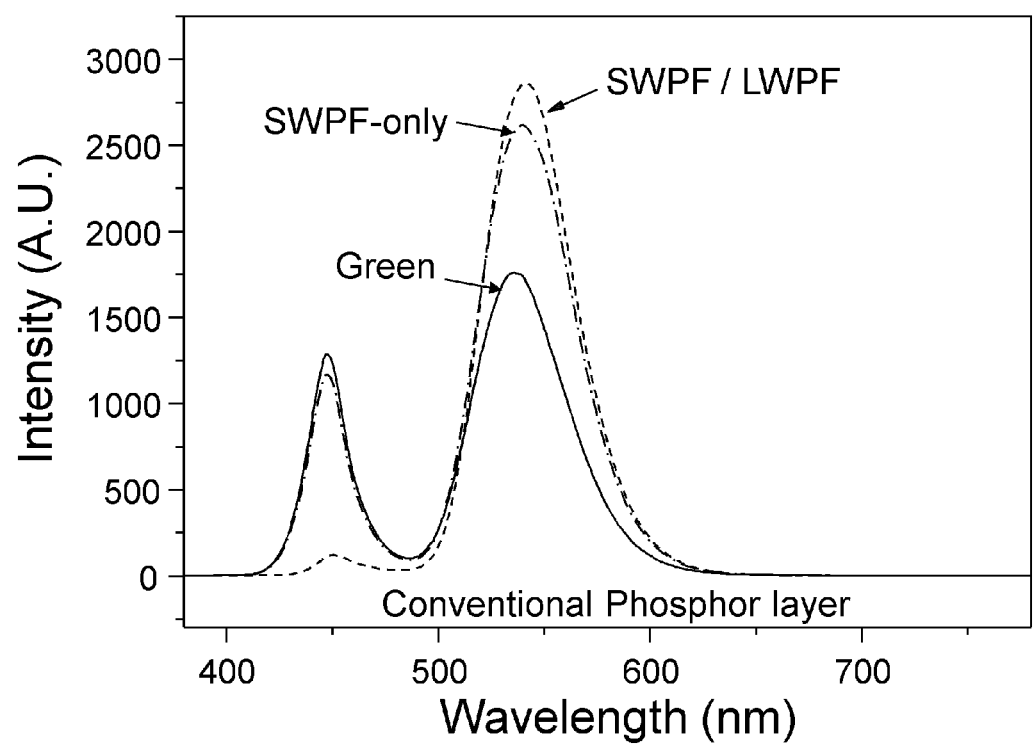
FIG. 40 is a diagram showing the change of intensity of the light emission peak of the green color conversion layer according to the short wavelength penetration filter and the long wavelength penetration filter of the present disclosure.
Figure 41:
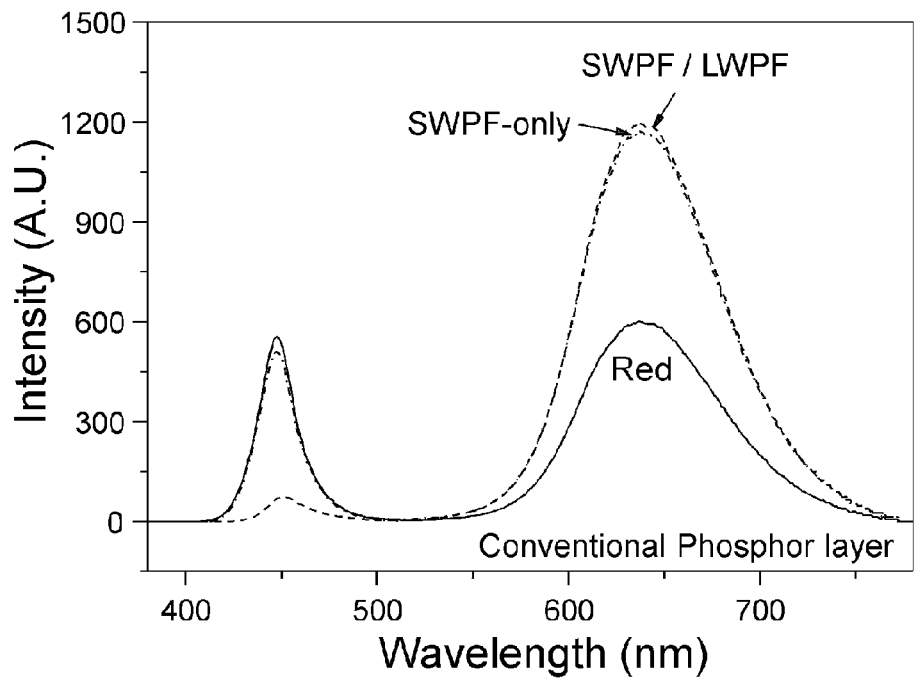
FIG. 41 is a diagram showing the change of intensity of the light emission peak of the red color conversion layer according to the short wavelength penetration filter and the long wavelength penetration filter of the present disclosure.

A short wavelength penetration filter (SWPF) (dielectric multilayer of terminal eighth-wave thick $0.5SiO_2$ (56 nm) and quarterwave thick $TiO_2/SiO_2$ (73 nm/112 nm)) was formed on the prepared second electrode by using an E-beam evaporator (base pressure $4.0 \times 10^{-5}$ torr, acceleration voltage 7 kV, oxygen partial pressure $1.9 \times 10^{-4}$ torr), and a green color conversion layer (50 μm) and a red color conversion layer (50 μm) corresponding to partial selected pixel sites were patterned thereon by means of screen printing. In detail, the green color conversion layer was obtained by processing $SrGa_2S_4$:Eu green powder phosphor into a paste form, in which green color conversion material is dispersed in a silicon binder (Shin-Etsu Chemical Co., Ltd. KER-2500A, KER-2500B) and hydrophobic silica (Degussa, hydrophobic aerosol R202) and made into a paste form. In addition, the red color conversion layer is obtained by processing CaAlSiN3:Eu red powder phosphor into a paste form, similar to the green color conversion layer, in which red color conversion material is dispersed in a silicon binder and hydrophobic silica and made into a paste form. The patterning process was performed by printing green and red color conversion materials by using spacers of 50 µm, then drying at 150° C. for 1 hour and hardening. FIGS. 34, 35 and 36 respectively show transmittance of the short wavelength penetration filter, a light emission peak of the green color conversion layer, and a light emission peak of the red color conversion layer. After that, a long wavelength penetration filter (dielectric multilayer of terminal eighth-wave thick $0.5TiO_2$ (25 nm) and quarter-wave thick $SiO_2/0.5TiO_2$ (73 nm/50 nm)) was formed on the green color conversion layer and the red color conversion layer by using an E-beam evaporator (base pressure $4.0\times10^{-5}$ torr, acceleration voltage 7 kV, oxygen partial pressure $1.9\times10^{-4}$ torr). FIG. 37 is a graph showing transmittance of the long wavelength penetration filter. In addition, FIG. 38 respectively shows transmittance of the short wavelength penetration filter, a blue light emission peak of the standardized subminiature LED element, and light emission peaks of the green and red color conversion layers. From this, it may be understood that blue light of the subminiature LED element is not influenced by the short wavelength penetration filter but green and red lights are reflected. Similarly, FIG. 39 respectively shows transmittance of the long wavelength penetration filter, a blue light emission peak of the standardized subminiature LED element, and light emission peaks of the green and red color conversion layers. From this, it may be understood that blue light of the subminiature LED element is reflected by the long wavelength penetration filter but green and red are not influenced. In addition, FIG. 40 shows the change of intensity of the light emission peak of the green color conversion layer according to the short wavelength penetration filter and the long wavelength penetration filter. From FIG. 40, it may be understood that the light emission peak of the green color conversion layer increases even though only the short wavelength penetration filter is applied, but the light emission peak of the green color conversion layer increases more when both the short wavelength penetration filter and the long wavelength penetration filter are adopted, in comparison to the case of adopting the short wavelength penetration filter only. Similarly, FIG. 41 shows the change of intensity of the light emission peak of the red color conversion layer according to the short wavelength penetration filter and the long wavelength penetration filter. From FIG. 41, it may be understood that the light emission peak of the red color conversion layer increases even though only the short wavelength penetration filter is applied, but the light emission peak of the red color conversion layer increases more when both the short wavelength penetration filter and the long wavelength penetration filter are adopted, in comparison to the case of adopting the short wavelength penetration filter only.

In this process, in order to form the long wavelength penetration filter only at the color conversion layer, after patterning is performed by means of photolithography, the long wavelength penetration filter is patterned by using a lift-off method of photoresist. In detail, the color conversion layer was coated by using AZ1512 photoresist (AZ Electronic Materials) by means of spin coating, and patterning was performed through soft baking (95° C., 1 minute), UV exposure (for 90 seconds by using a mask) and development (AZ300 developer, AZ Electronic Materials, dipped for 1 minute and then taken out and washed).

Figure 42:
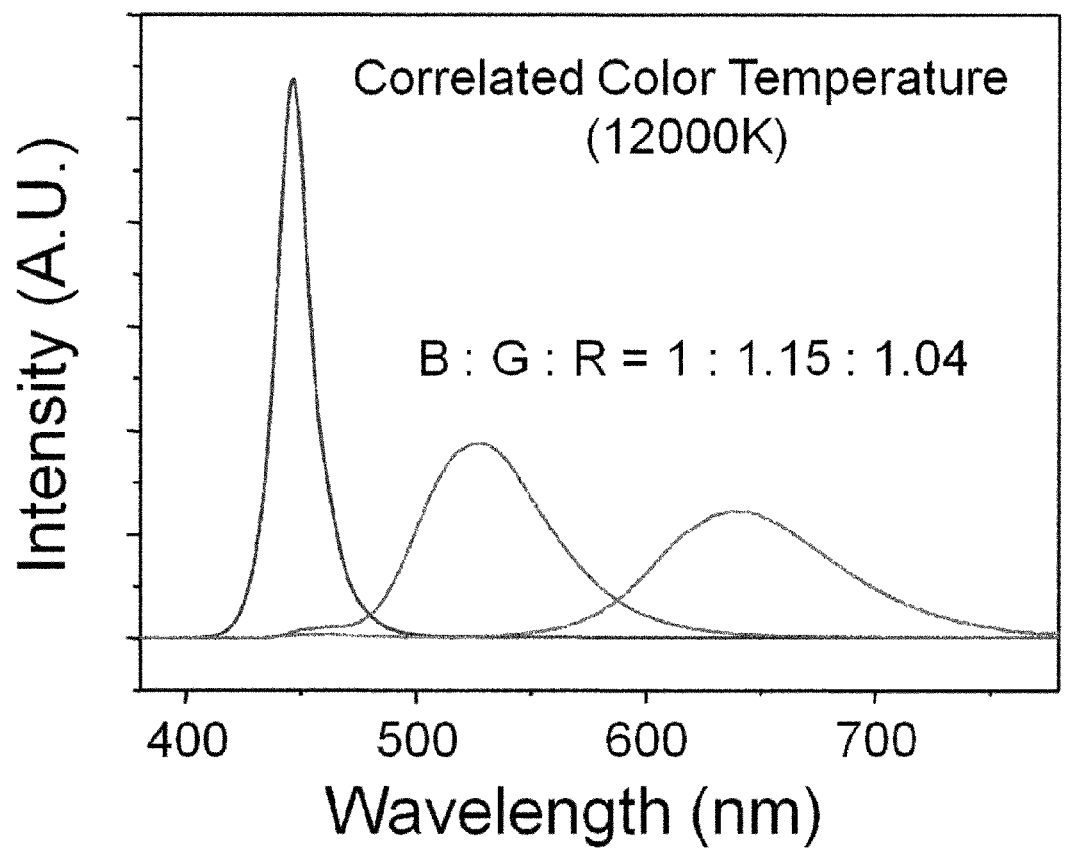
FIG. 42 is a diagram showing light emission ratios and spectrums of the subminiature blue LED and the green and red color conversion layers of the present disclosure at a color temperature of 12000K.

FIG. 42 shows light emission ratios and spectrums of the subminiature blue LED and the green and red color conversion layers at a color temperature of 12000K. Referring to FIG. 42, after manufacturing a subminiature blue LED display according to the present disclosure, a light emission ratio at a traditional LED color temperature of 12000K was measured as blue:green:red=1:1.15:1.04.

The full-color LED display device and its manufacturing method according the present disclosure may be widely utilized over the entire display industries.

The invention claimed is:

1. A manufacturing method of a full-color LED display device, the method comprising:
 (a) forming a plurality of first electrodes on a substrate;
 (b) attaching at least five subminiature blue LED elements to each unit pixel site formed on the first electrode;
 (c) forming an insulation layer on the substrate;
 (d) forming a plurality of second electrodes on the insulation layer; and
 (e) successively patterning a green color conversion layer and a red color conversion layer on the second electrode corresponding to partial unit pixel sites selected from the unit pixel sites.

2. A manufacturing method of a full-color LED display device, the method comprising:
 (a) forming a plurality of first electrodes on a substrate;
 (b) attaching at least one LED element among at least five subminiature blue, green and red LED elements to each unit pixel site formed on the first electrode;
 (c) forming an insulation layer on the substrate; and
 (d) forming a plurality of second electrodes on the insulation layer.

3. The manufacturing method of a full-color LED display device according to claim 1, wherein the first electrodes and second electrodes are formed in a stripe shape to cross each other, and the unit pixel sites are formed at portions corresponding to crossing points of the first electrodes and the second electrodes.

4. The manufacturing method of a full-color LED display device according to claim 1, wherein the step (b) includes:
 (i) forming first coupling linkers, which are capable of being coupled to the unit pixel sites, on the unit pixel sites formed on the first electrode;
 (ii) adding metal micro powder capable of being coupled to the first coupling linkers;
 (iii) attaching at least five subminiature blue LED elements, to which second coupling linkers capable of being coupled to the metal micro powder are attached, to each unit pixel site; and
 (iv) forming a metallic ohmic layer between the unit pixel site and the subminiature blue LED element by soldering the metal micro powder.

5. The manufacturing method of a full-color LED display device according to claim 2, wherein the step (b) includes:
 (i) forming first coupling linkers, which are capable of being coupled to the unit pixel sites, on the unit pixel sites formed on the first electrode;
 (ii) adding metal micro powder capable of being coupled to the first coupling linkers;
 (iii) attaching at least five LED elements among the subminiature blue, green and red LED elements, to which second coupling linkers capable of being coupled to the metal micro powder are attached, to each unit pixel site; and
 (iv) forming a metallic ohmic layer between the unit pixel site and the subminiature blue LED element by soldering the metal micro powder.

6. The manufacturing method of a full-color LED display device according to claim 1, wherein the subminiature blue, green and red LED elements have a diameter of 50 to 3000 nm with a single or bundle type, and an insulation coating is formed at an outer circumference of the LED elements.

7. The manufacturing method of a full-color LED display device according to claim 1, wherein the subminiature blue, green and red LED elements are in a paste or ink form.

8. The manufacturing method of a full-color LED display device according to claim 1, further comprising
forming a short wavelength penetration filter (SWPF) between the step (d) and the step (e); and
forming a long wavelength penetration filter (LWPF) after the step (e).

9. A full-color LED display device, comprising:
(a) a plurality of first electrodes formed on a substrate;
(b) at least five subminiature blue LED elements attached to each unit pixel site formed on the first electrode;
(c) an insulation layer formed on the substrate and the blue LED element;
(d) a plurality of second electrodes formed on the insulation layer; and
(e) a green color conversion layer and a red color conversion layer formed on the second electrode corresponding to partial unit pixel sites selected from the unit pixel sites.

10. A full-color LED display device, comprising:
(a) a plurality of first electrodes formed on a substrate;
(b) at least one LED element among at least five subminiature blue, green and red LED elements attached to each unit pixel site formed on the first electrode;
(c) an insulation layer formed on the substrate; and
(d) a plurality of second electrodes formed on the insulation layer.

11. The full-color LED display device according to claim 10, wherein the subminiature blue, green and red LED elements have a diameter of 50 to 3000 nm with a single or bundle type, and an insulation coating is formed at an outer circumference of the LED elements.

12. The full-color LED display device according to claim 10, wherein a metallic ohmic layer is formed between the unit pixel site and the subminiature LED element.

13. The full-color LED display device according to claim 10, wherein the unit pixel site has an area of $1 \times 10^4$ $\mu m^2$ or below, and grooves are formed at the unit pixel sites of the first electrodes.

14. The full-color LED display device according to claim 10, wherein the first electrodes and second electrodes are formed in a stripe shape to cross each other, and the unit pixel sites are formed at portions corresponding to crossing points of the first electrodes and the second electrodes.

15. The full-color LED display device according to claim 9, wherein a short wavelength penetration filter is formed between the second electrode and the subminiature red or green LED elements, and a long wavelength penetration filter is formed on the subminiature red or green LED elements.

16. The full-color LED display device according to claim 9, wherein the subminiature blue, green and red LED elements have a diameter of 50 to 3000 nm with a single or bundle type, and an insulation coating is formed at an outer circumference of the LED elements.

17. The full-color LED display device according to claim 9, wherein a metallic ohmic layer is formed between the unit pixel site and the subminiature LED element.

18. The manufacturing method of a full-color LED display device according to claim 2, wherein the first electrodes and second electrodes are formed in a stripe shape to cross each other, and the unit pixel sites are formed at portions corresponding to crossing points of the first electrodes and the second electrodes.

19. The manufacturing method of a full-color LED display device according to claim 1, wherein the subminiature blue, green and red LED elements have a diameter of 50 to 3000 nm with a single or bundle type, and an insulation coating is formed at an outer circumference of the LED elements.

20. The manufacturing method of a full-color LED display device according to claim 1, wherein the subminiature blue, green and red LED elements are in a paste or ink form.

* * * * *